United States Patent [19]

Matsumoto et al.

[11] Patent Number: 4,878,120
[45] Date of Patent: * Oct. 31, 1989

[54] SOLID STATE IMAGE SENSOR INCLUDING STATIC INDUCTION TRANSISTOR WITH GATE SURROUNDING SOURCE AND/OR DRAIN

[75] Inventors: Kazuya Matsumoto; Tsutomu Nakamura, both of Ina, Japan

[73] Assignee: Olympus Optical Co., Ltd., Japan

[*] Notice: The portion of the term of this patent subsequent to May 13, 2003 has been disclaimed.

[21] Appl. No.: 715,641

[22] Filed: Mar. 25, 1985

[30] Foreign Application Priority Data

Mar. 29, 1984 [JP] Japan ................................. 59-525

[51] Int. Cl.⁴ .................... H04N 3/15; H01L 27/14
[52] U.S. Cl. .................... 358/213.12; 357/30; 357/22
[58] Field of Search ................ 358/212, 213, 41, 44, 358/213.12; 357/24 L R, 30, 30 G, 30 H, 30 D, 30 I, 22, 22 B, 31, 32; 250/211 J, 578

[56] References Cited

U.S. PATENT DOCUMENTS

| 4,242,694 | 12/1980 | Koibe et al. ........................ 357/30 |
| 4,326,210 | 4/1982 | Aso et al. . |
| 4,363,963 | 12/1982 | Ando ................................. 250/211 J |
| 4,377,817 | 3/1983 | Nishizawa et al. . |
| 4,524,391 | 6/1985 | Nishizawa et al. ........ 357/24 LR X |
| 4,525,742 | 6/1985 | Nishizawa et al. ........ 357/24 LR X |
| 4,531,156 | 7/1985 | Nishizawa et al. ................ 358/213 |
| 4,556,909 | 12/1985 | Yamada ..................... 357/24 LR X |
| 4,562,474 | 12/1985 | Nishizawa ........................ 357/30 X |
| 4,571,626 | 2/1986 | Yamada ......................... 358/213.12 |
| 4,589,027 | 5/1986 | Nakamura et al. ................ 358/213 |
| 4,651,015 | 3/1987 | Nishizawa et al. .......... 357/22 B X |
| 4,651,180 | 3/1987 | Nishizawa et al. ............... 357/22 B |
| 4,733,286 | 3/1988 | Matsumoto ......................... 357/30 |

FOREIGN PATENT DOCUMENTS

| 0096725 | 12/1983 | European Pat. Off. . |
| 2741226 | 3/1978 | Fed. Rep. of Germany . |
| 3008858 | 9/1980 | Fed. Rep. of Germany . |
| 3234044 | 4/1983 | Fed. Rep. of Germany . |
| 3446972 | 7/1985 | Fed. Rep. of Germany . |
| 59-188278 | 10/1984 | Japan .................................... 358/213 |
| 60-140752 | 7/1985 | Japan . |

OTHER PUBLICATIONS

*Integrated Circuit Engineering*, Glaser et al., Addison-Wesley Pub. Co., Reading, Mass., May 1979, Fig. 3.4, p. 80. Copy in 210 Library.
Nishizawa, Jun-ichi, Static Induction Transistor, "Japanese Annual Reviews in Electronics, Computers & Telecommunications Semiconductors Technologies", 1982, pp. 201-219.
Nishizawa, Jun-Ichi, Static Induction Transistor Image Sensors, "IEEE Transactions on Electron Devices", vol. ED-26, No. 12, Dec. 1979.
1974 IEEE International Solid-State Circuits Conference; Feb. 13, 1974.

Primary Examiner—Arthur T. Grimley
Assistant Examiner—J. Pendegrass
Attorney, Agent, or Firm—Arnold, White & Durkee

[57] ABSTRACT

A disclosed solid state image pick-up element is constructed by a lateral static induction transistor in which source and drain regions thereof are arranged in a surface of a semiconductor layer formed on a substrate and a gate region for storing a light charge completely surrounds at least one of the source region and the drain region, whereby a source-drain current flows in parallel with the surface of the semiconductor layer. Moreover, a disclosed solid state image sensor utilizing the solid state image pick-up element mentioned above further includes a biasing means for inversely biasing the source and drain regions during a light signal storing period.

20 Claims, 30 Drawing Sheets

FIG_6A
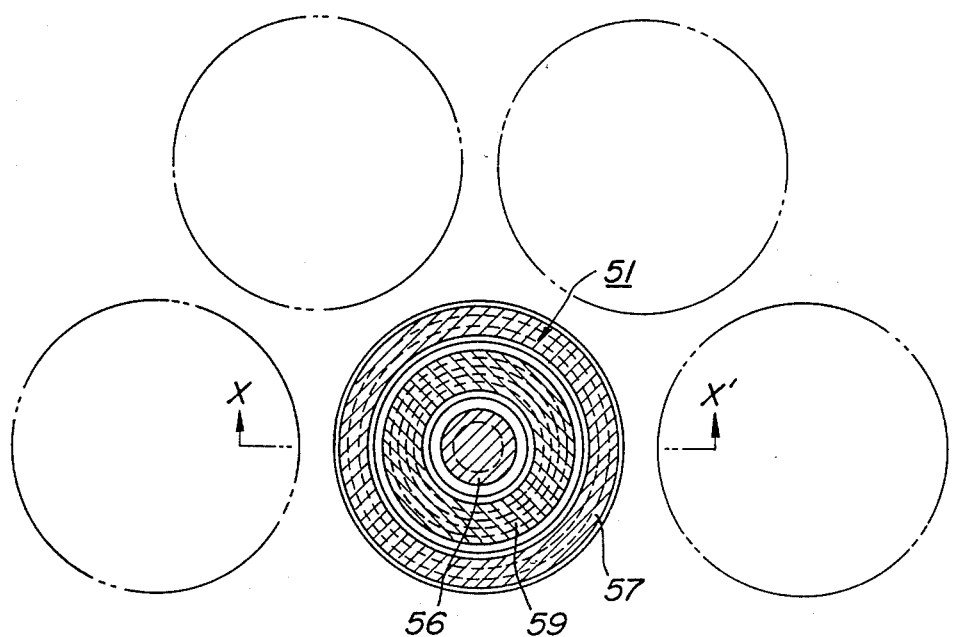
FIG_6B
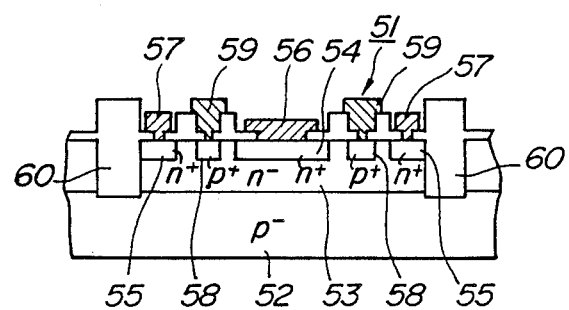

FIG_14
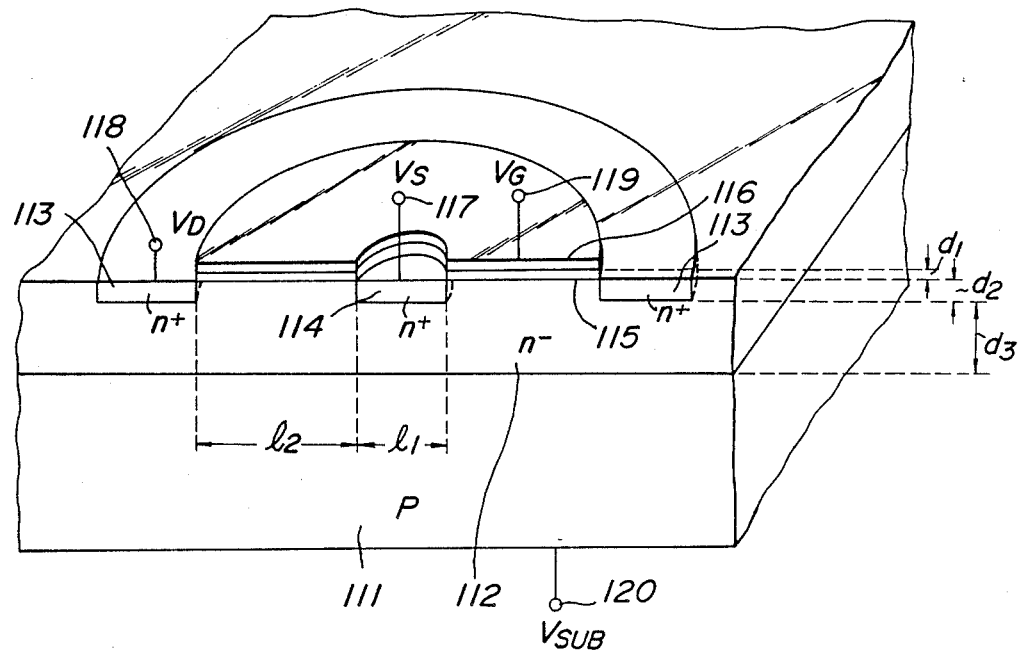
FIG_15
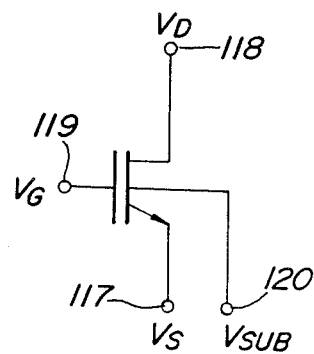

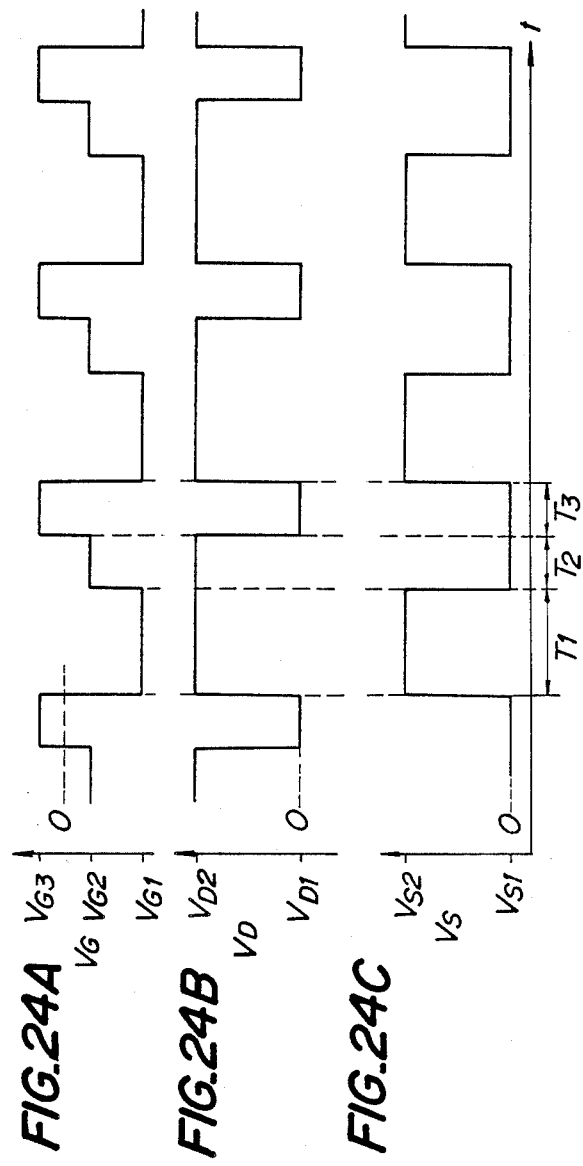

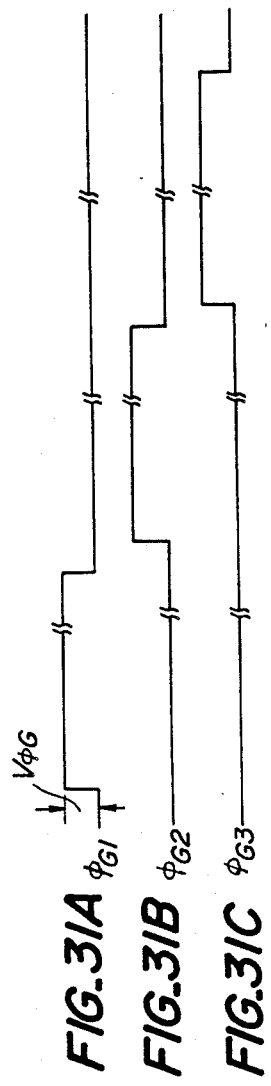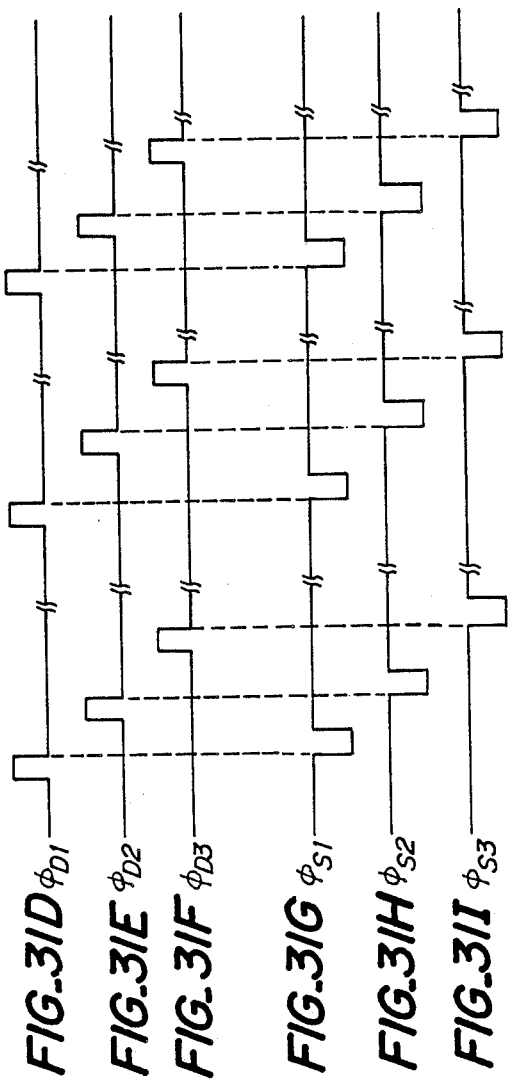

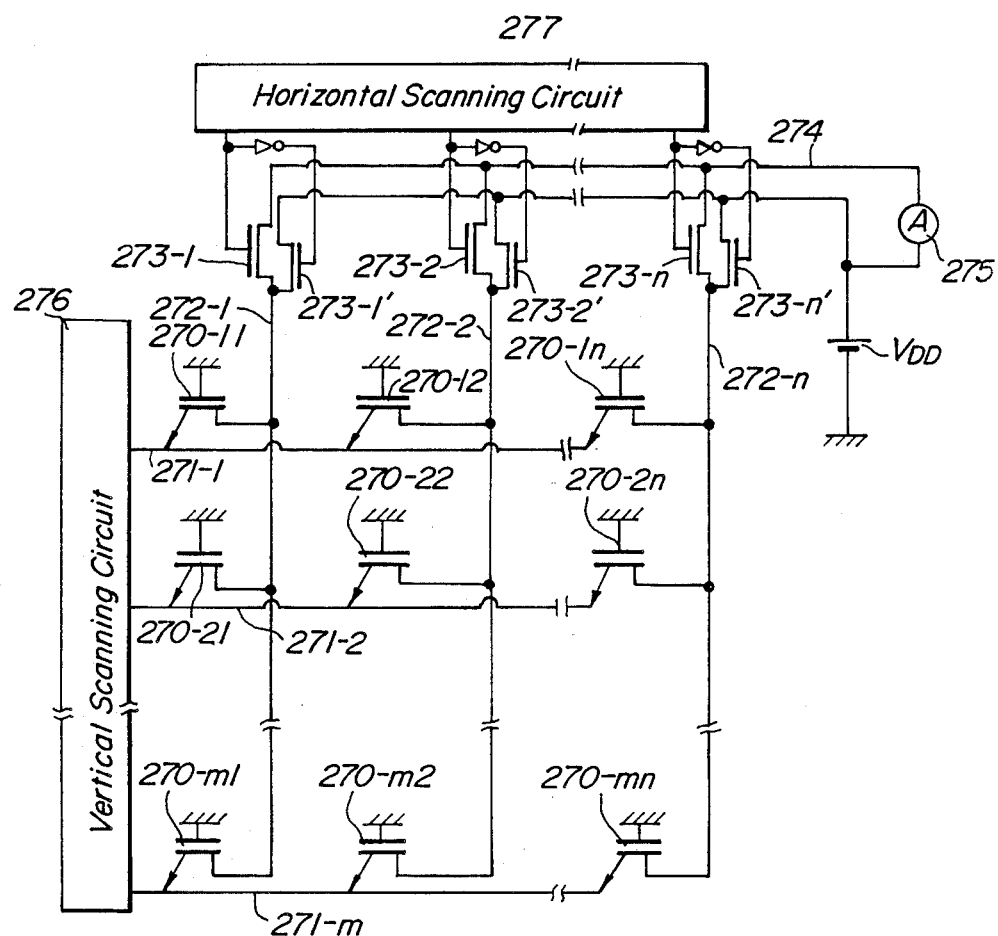
FIG_35

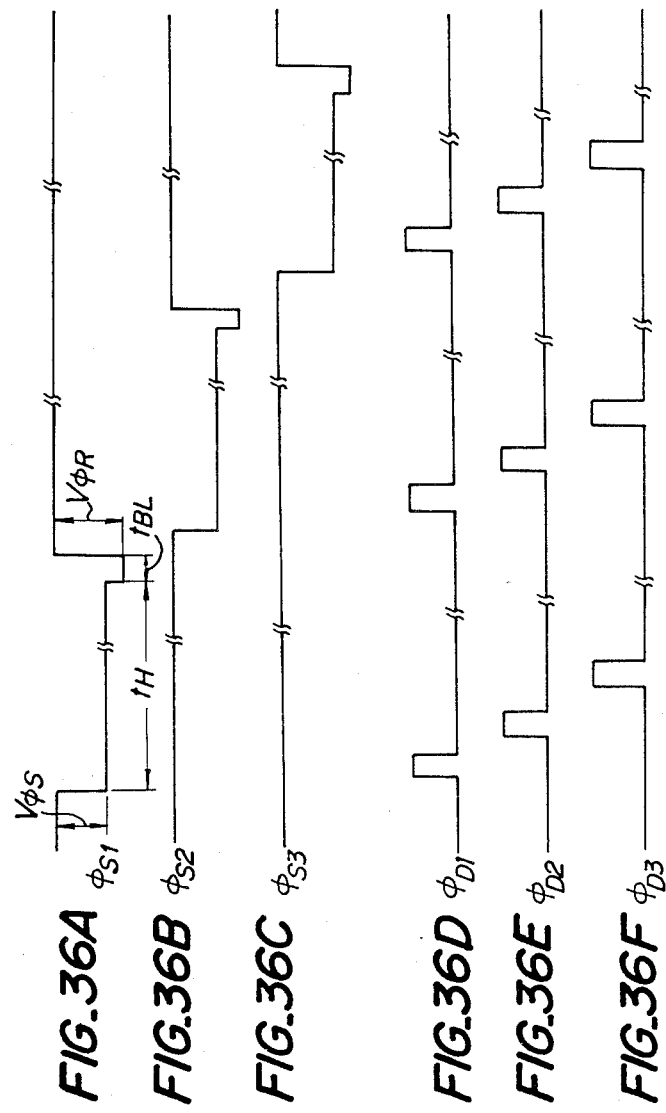

SOLID STATE IMAGE SENSOR INCLUDING STATIC INDUCTION TRANSISTOR WITH GATE SURROUNDING SOURCE AND/OR DRAIN

BACKGROUND OF THE INVENTION

The present invention relates to a solid state image sensor utilizing a static induction transistor (hereinafter, abbreviated as SIT) as an image pick-up element.

As a conventional solid state image sensor for use in video cameras, facsimile machines, etc. there has been proposed a charge transfer device such as BBD, CCD, etc. or a MOS transistor device, However, these solid state image sensors have various disadvantages such as charge leakage during the charge transferring operation and a low light detection sensitivity.

Recently, in order to eliminate the disadvantages mentioned above, there has been proposed a solid state image sensor comprising SITs. The SIT is a kind of phototransistor having both a photoelectrical converting function and a photoelectric charge storing function, and has various advantages such as high input impedance, high speed property, unsaturated property, low noise, low consumed power etc., as compared with a field effect transistor or a junction transistor. Therefore, if use is made of the SIT as a solid state image pick-up element, it is possible to form a solid state image sensor having high sensitivity, high speed response and wide dynamic range.

Such image sensor has been disclosed in the European patent application No. 83900059.3 (Publication No. 0096725) published on Dec. 28, 1983.

FIG. 1 is a cross sectional view showing one embodiment of the SIT consisting of one pixel of the known solid state image sensor. In this embodiment, an SIT 1 has a vertical type construction in which a drain region is constructed by an n+ substrate 2 and a source region is constructed by an n+ region 4 is formed in an n− epitaxial layer 3 which is formed on the n+ substrate 2 and constitutes a channel region. In the epitaxial layer 3 there is further formed a p+ signal storing gate region 5 surrounding the n+ source region 4, and on the gate region 5 is formed an electrode 7 via an insulating film 6. In this manner, a gate electrode having a so-called MIS construction consisting of metal electrode/insulating film/semiconductor gate region. Moreover, an impurity concentration in the n− epitaxial layer 3 which constitutes the channel region is set to such a low level that the channel region has been depleted even if a bias applied to the gate electrode 7 is 0 V so that a pinch-off voltage due to a high potential barrier can be obtained.

Hereinafter, an operation of the SIT 1 mentioned above will be explained. When light is made incident upon the channel region 3 and the gate region 5 under the condition that a bias is not applied between the drain and the source, holes of electron-hole pairs induced therein are stored in the gate region 5 and electrons are discharged from the drain region 2 to the ground. The holes stored in the gate region 5 in response to the incident light function to increase a potential of the gate region 5 and to decrease the potential barrier of the channel region 3 in response to the incident light intensity. If the bias voltage is applied between the drain and the source and also a forward bias voltage is applied to the gate electrode 7, a current flows between the drain and the source in response to the amount of the holes stored in the gate region 5 and thus an output amplitude in accordance with the incident light intensity can be obtained. The light amplification S is described as follows.

$$S \alpha \frac{l_1 \times l_2}{a^2}$$

where $2a$ is an inner diameter of the ring-shaped gate region 5, $l_1$ is a depth of the gate region 5 and $l_2$ is a distance between gate and drain regions. In the SIT 1 mentioned above, a value of the light amplification S is normally greater than $10^3$, and is higher by one order than that of a bipolar transistor. As can be seen from the above, in order to obtain the higher light amplification, it is necessary to make the ditance $2a$ small and to make the depth of the epitaxial layer 3 and that of the gate region 5 large. For example, in order to obtain the light amplification S of $10^3$ to $10^4$, it is necessary to satisfy the condition that $l_1=2$ to 3 $\mu$m and $l_2=5$ to 6 $\mu$m.

In the solid state image sensor mentioned above, it is necessary to arrange an isolation region 8 between adjacent SITs so as to isolate the signal charges induced in respective SITs. This isolation is realized by a normal isolation method such as oxide film isolation, diffusion isolation or V-shape recess isolation. In this case, the isolation region 8 extends from a surface of the epitaxial layer 3 to the substrate 2, and thus it is difficult to form the isolation region 8 if the epitaxial layer 3 is thick. Moreover, as mentioned above, it is necessary to make the gate region 5 thick so as to increase the light amplification S, but this is not realized by the diffusion method. Further, if the gate region 5 is made thicker, the spectral sensitivity property becomes poor due to an absorption of light in the gate region 5. Therefore, in the known solid state image sensor consisting of vertical type SITs, the sensitivity is limited due to the construction thereof.

In order to eliminate the drawbacks mentioned above, the present applicant has proposed a solid state image sensor utilizing a lateral type SIT in Japanese patent application No. 58-245,059 filed on Dec. 28, 1983 and published on July 25, 1985 as Japanese patent laid-open publication, Ko Kai Sho No. 60-140,752. FIG. 2 is a cross sectional view showing one embodiment of a lateral type SIT 11 (hereinafter, abbreviated as LSIT). At first, an n− epitaxial layer 13 consisting of a channel region is formed on a p−- or p-type substrate 12, and an n+ source region 14 and a drain region 15 both extending from the surface of the epitaxial layer 13 to the substrate 12 are foremed in the epitaxial layer 13. In addition, a gate electrode 17 made of polysilicon is formed on a surface of the epitaxial layer 13 through a gate insulating film 16 so as to construct an insulating gate. Moreover, a source electrode 18 and a drain electrode 19 both made of Al are arranged on the source region 14 and the drain region 15 respectively, and an insulating region 20 extending from the surface of the epitaxial layer 13 to the substrate 12 is arranged so as to isolate one LSIT from adjacent LSITs. Hereinafter, the LSIT having such an insulating gate construction will be abbreviated as IGLT (Insulated Gate Lateral Transistor).

In the IGLT 11 illustrated in FIG. 2, if conditions such as source (drain) electrode voltage $V_s=0$, drain (source) electrode voltage $V_D=0$, gate electrode voltage $V_G=V$ ($V<0$) and substrate voltage $V_{SUB}=V_1$ ($V_1<0$) are satisfied under a dark current condition such that no light is made incident thereupon, the gate voltage V is applied to the gate electrode 17 and thus a depletion layer extends over a the whole channel from a boundary between the gate region 16 made of the insulating film and the channel region 13. In this case, since an unsteady state is realized, no positive holes exist in the depletion layer. Then, when light is made incident upon the depletion layer, hole-electron pairs are generated therein and the holes are stored in the boundary between the gate insulating film 16 and the channel region 13. Moreover, the height of the potential barrier between the source and the drain is decreased by the amount of the holes stored in the boundary.

After a lapse of a certain constant period for storing the positive holes, when a positive voltage is applied to the drain electrode 19 a source-drain current $I_{SD}$ flows corresponding to the amount of the holes stored in the boundary. This current $I_{SD}$ is increased as compared with the case where no positive holes exist in the boundary when no light is incident. That is to say, a variation of the incident light is represented by that of the source-drain current $I_{SD}$.

Further, the present applicant has also proposed an LSIT having a junction gate construction in Japanese patent laid-open publication No. 245,059/83.

In the solid state image sensor in which LSITs mentioned above are arranged in matrix form in the X and Y directions as the solid state image pick-up element, it is necessary to operate successive LSITs so as to read-out successive light signals corresponding to respective pixels. However, since the image sensor mentioned above cannot control a light signal storing operation and a light signal reading out operation preferably, there is a drawback that the most suitable photoelectric converting operation cannot consistently be realized in response to the variation in the amount of incident light.

SUMMARY OF THE INVENTION

The present invention has for its object to eliminate the drawbacks mentioned above and to provide a solid state image pick-up element which has high sensitivity and can be manufactured easily.

According to the invention, a solid state image pick-up element includes a static induction transistor which comprises:

a source region and a drain region arranged in a surface of a semiconductor layer formed on a substrate made of a semiconductor material having a high resistivity or an insulating material; and a gate region for storing a light signal therein arranged to completely surround at least one of said source region and said drain region, whereby a source-drain current flows in parallel with the surface of the semiconductor layer.

Another object of the invention is to provide a solid state image sensor which can perform the most suitable photoelectric converting operation in accordance with the incident light amount and can derive an image signal having good S/N. According to the invention, a solid state image sensor comprises a solid state image pick-up element including at least one static induction transistor which comprises a source region and a drain region arranged in a surface of a semiconductor layer formed on a substrate made of a semiconductor material having a high resistivity or an insulating material, and a gate region at least a part of which is formed between said source region and said drain region, whereby a source-drain current flows in parallel with the surface of said semiconductor layer;

means for inversely biasing said source region and drain region during a light signal storing period; and means for reading out a light signal stored in the solid state image pick-up element.

BRIEF DESCRIPTION OF THE DRAWINGS

FIGS. 6A and 6B are plan and cross sectional views, respectively, showing a fourth embodiment of the solid state image pick-up element according to the invention;

FIG. 14 is a perspective view depicting the solid state image pick-up element shown in FIG. 4 for explaining the operation thereof;

FIG. 15 is an equivalent circuit diagram showing the embodiment illustrated in FIG. 14;

FIGS. 24A to 24C are waveforms respectively depicting gate, drain and source voltages for explaining a reset operation due to the drain voltage;

FIGS. 31A to 31I are waveforms for respectively explaining the operation of the solid state image sensor shown in FIG. 30;

FIG. 35 is a circuit diagram illustrating a fifth embodiment of the solid state image sensor according to the invention in which the selection of a solid state image pick-up element is performed due to the source and drain voltages; and FIGS. 36A to 36F are waveforms for respectively explaining the operation of the solid state image sensor shown in FIG. 35.

DESCRIPTION OF THE PREFERRED EMBODIMENTS

Figure 3A:
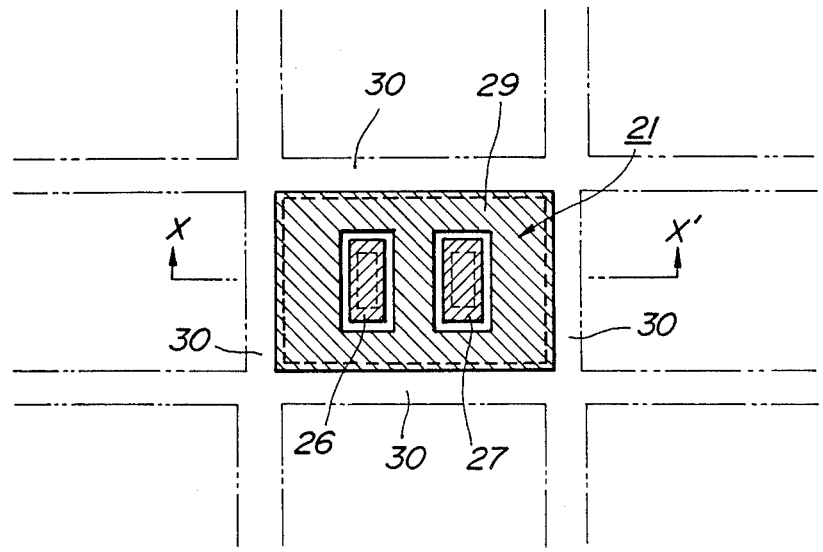
FIGS. 3A and 3B are plan and cross sectional views, respectively, showing a first embodiment of the solid state image pick-up element according to the invention.
Figure 3B:
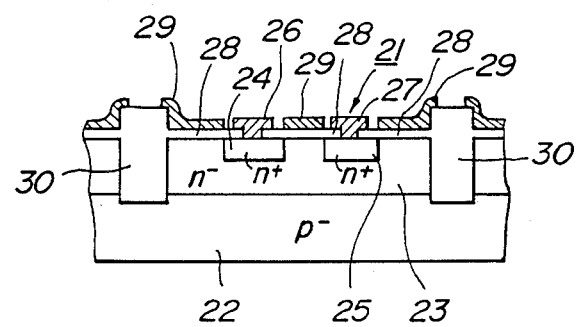

FIG. 3A is a plan view showing a first embodiment of a solid state image pick-up element according to the invention, and FIG. 3B is a cross sectional view cut along the line X-X' of the embodiment shown in FIG. 3A. In this embodiment, a solid state image pick-up element 21 has an IGLT construction. An $n^-$ epitaxial layer 23 consisting of a channel region is formed on a $p^-$ substrate 22, and in this epitaxial layer 23 are formed an $n^+$ source region 24 and an $n^+$ drain region 25 by the addition of n-type impurities. Further, a source electrode 26 and a drain electrode 27 both made of Al are respectively formed on the source region 24 and the drain region 25, and a gate electrode 29 made of a transparent conductive material such as $SnO_2$ and ITO is formed on a surface of the epitaxial layer 23 through a gate insulating film 28 in such a manner that the source region 24 and the drain region 25 are surrounded thereby so as to generate an insulating gate. Moreover, in this embodiment, a plurality of IGLTs 21 are arranged in the substrate 22 in a matrix manner, and thus adjacent pixels each consisting of one IGLT are electrically isolated by the isolation region 30 made of a semiconductor oxide, an insulating material, etc. which extends from a surface of the epitaxial layer 23 to the substrate 22.

In the present embodiment, since the insulating gate is arranged in such a manner that the source region 24 and the drain region 25 are completely surrounded thereby, a gate area i.e. an aperture rate can be made larger and a channel region between the source and the drain can be widened. As a result, the stability of the gate potential in the case of light incidence can be improved, and thus a good S/N can be realized.

Figure 4A:
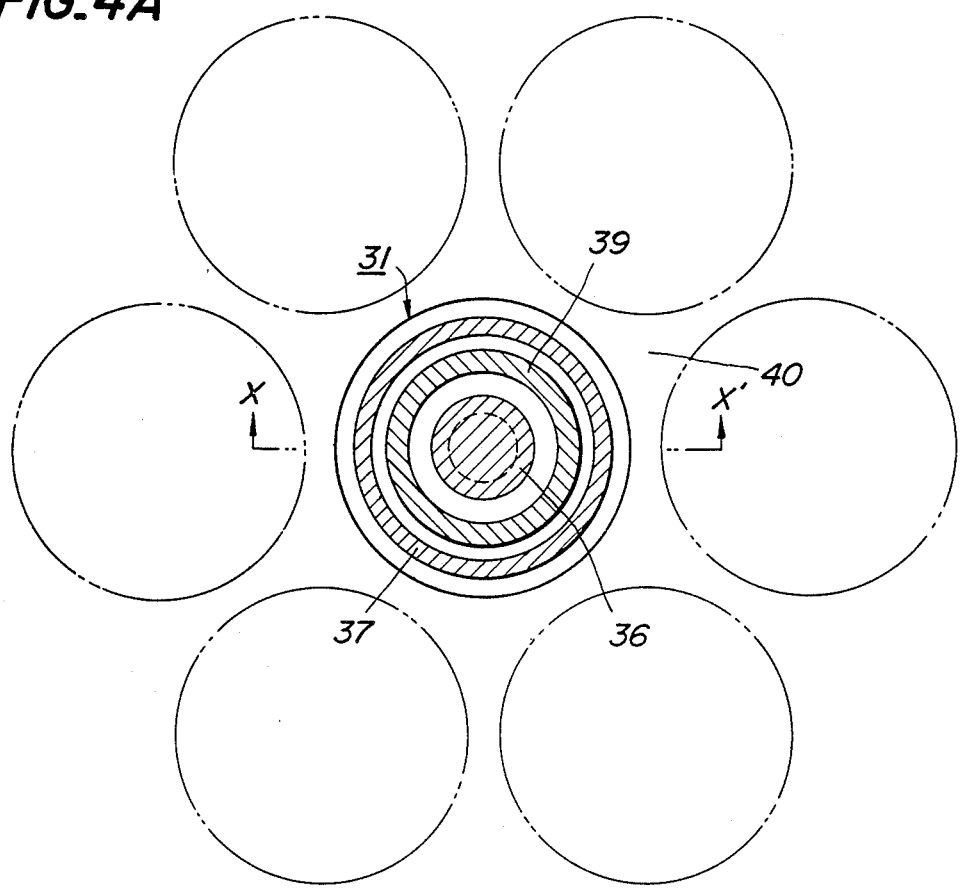
FIGS. 4A and 4B are plan and cross sectional views, respectively, illustrating a second embodiment of the solid state image pick-up element according to the invention.
Figure 4B:
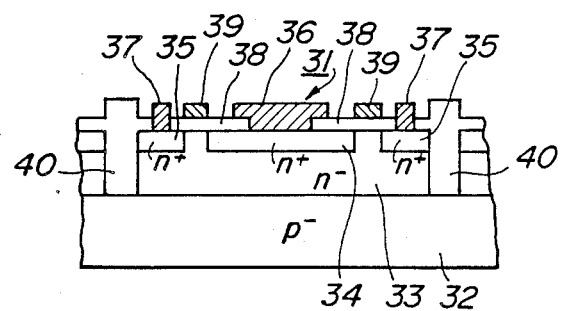

FIG. 4A is a plan view showing a second embodiment of the solid state image pick-up element according to the invention, and FIG. 4B is a cross sectional view cut along line X-X' of the embodiment shown in FIG. 4A. In this embodiment, the solid state image pick-up element 31 has an IGLT construction the same as that described in the first embodiment, but the source region, drain region and insulating gate are formed in a concentric manner and only the source region is completely surrounded by the insulating gate. That is, an $n^-$ epitaxial layer 33 consisting of the channel region is formed on a $p^-$ substrate 32, and in the epitaxial layer 33 are formed an $n^+$ circular source region 34 and an $n^+$ drain region 35 which completely surround the source region 34 in a concentric manner by addition of n type impurities. Further, a circular source electrode 36 and a concentric drain electrode 37, both made of Al, are formed on the source region 34 and the drain region 35 respectively, and a concentric gate electrode 39 made of transparent conductive materials such as $SnO_2$, and ITO is arranged on a surface of the epitaxial layer 33 between the source region 34 and the drain region 35 through a gate insulating film 38 in such a manner that only the source region 34 is completely surrounded thereby so as to generate a concentric insulating gate. Moreover, in this embodiment, a plurality of IGLTs 31 are arranged at the vertexes of a triangle in the substrate 32, and thus adjacent pixels each consisting of one IGLT are electrically isolated by an isolation region 40 made of a semiconductor oxide, insulating material, etc. which extends from a surface of the epitaxial layer 33 to the substrate 32.

In the present embodiment, the same effects as those of the first embodiment can be obtained. In addition, since the source region 34, drain region 35 and insulating gate are formed in a concentric manner, a variation of properties between pixels can be minimized. Further, since the insulating gate is not directly in contact with the isolation region 40, the surface leak current on the isolation region 40 can be ignored.

Moreover, in this embodiment, only the drain region 35 may be surrounded by the insulating gate by exchanging the source region 34 and the drain region 35. Also in this case, the same effects mentioned above can be obtained, Further, in this embodiment, the shape of each of the pixels is not limited to being circular, but it is possible to use another topologically equivalent shape as one pixel.

Figure 5A:
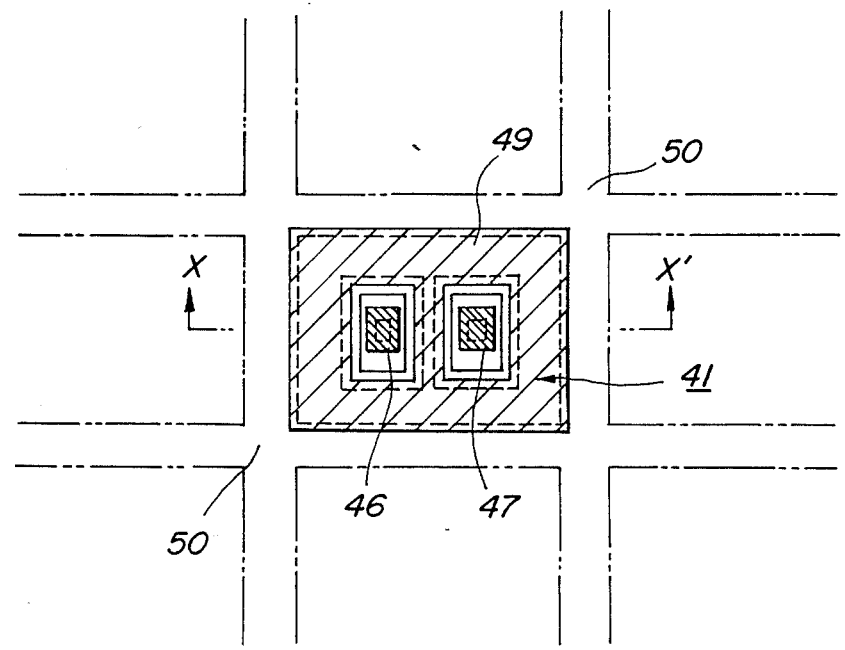
FIGS. 5A and 5B are plan and cross sectional views, respectively, depicting a third embodiment of the solid state image pick-up element according to the invention.
Figure 5B:
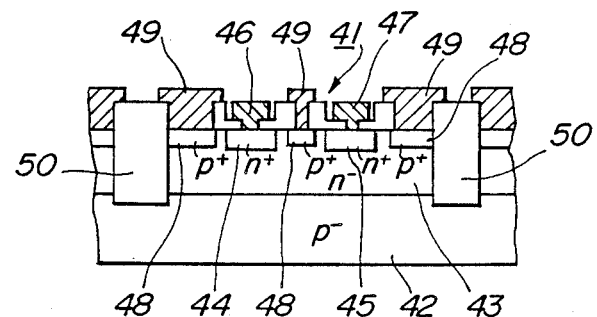

FIG. 5A is a plan view showing a third embodiment of the solid state image pick-up element according to the invention, and FIG. 5B is a cross sectional view cut along line X-X' line of the embodiment shown in FIG. 5A. In this embodiment, the solid state image pick-up element 41 comprises an LSIT having a junction gate construction (hereinafter, abbreviated as JGLT (Junction Gate Lateral Transistor)), in which the source region and the drain region are completely surrounded by the junction gate, as was described in the first embodiment. That is, an $n^-$ epitaxial layer 43 consisting of a channel region is formed on a $p^-$ substrate 42, and in the epitaxial layer 43 are formed an $n^+$ source region 44 and an $n^+$ drain region 45 by the addition of n-type impurities. Further, a source electrode 46 and a drain electrode 47 both made of Al are formed on the source region 44 and the drain region 45, respectively, and a $p^+$ gate region 48 formed by the addition of p type impurities is arranged in the epitaxial layer 43 in such a manner that the source region 44 and the drain region 45 are completely surrounded thereby. Further, a gate electrode 49 made of transparent conductive material such as $SnO_2$ or ITO is formed on the $p^{30}$ gate region 48 so as to generate a junction gate. Moreover, in this embodiment, a plurality of JGLTs 41 are arranged in the substrate 42 in a matrix manner, and thus adjacent pixels each consisting of one JGLT are electrically isolated by the isolation region 50 made of a semiconductor oxide, an insulating material, etc. which extends from the surface of the epitaxial layer 43 to the substrate 42.

The present embodiment has the same construction as that of the first embodiment except for the construction of the gate, and thus the functions and effects thereof are the same as those of the first embodiment.

FIG. 6A is a plan view showing a fourth embodiment of the solid state image pick-up element according to the invention, and FIG. 6B is a cross sectional view cut along line X-X' of the embodiment shown in FIG. 6A. In this embodiment, the solid state image pick-up element 51 has a JGLT construction the same as that described in the third embodiment, but the source region, drain region and gate region are formed in a concentric manner and only the source region is completely surrounded by the gate region. That is to say, an $n^-$ epitaxial layer 53 consisting of a channel region is formed on a $p^-$ substrate 52, and in the epitaxial layer 53 are formed an $n^+$ circular source region 54 and an $n^+$ drain region 55 which surrounds completely the source region 54 in a concentric manner by the addition of n type impurities. Further, a circular source electrode 56 and a concentric drain electrode 57 both made of Al are formed on the source region 54 and the drain region 55 respectively, and a $p^{30}$ gate region 58 formed by the addition of p type impurities is formed in the epitaxial layer 53 between the source region 54 and the drain region 55 in such a manner that the source region 54 is completely surrounded thereby. On the gate region 58 is formed a concentric gate electrode 59 made of transparent conductive materials such as $SnO_2$ and ITO so as to generate a concentric junction gate. Moreover, in this embodiment, adjacent pixels are electrically isolated by an isolation region 60 made of a semiconductor oxide, insulating material, etc. which extends from a surface of the epitaxial layer 53 to the substrate 52.

Figure 6C:
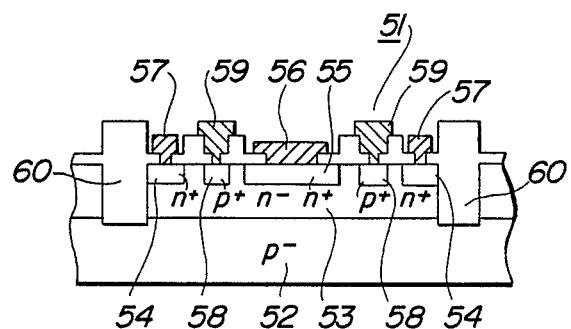
FIG. 6C is an alternate construction to the embodiment of FIGS. 6A and 6B.

In the present embodiment, the construction thereof is the same as that of the second embodiment except for the gate construction, and thus the functions and effects thereof are the same as those of the second embodiment. Moreover, the drain region 55 may be completely surrounded by the gate region 58 by exchanging the source region 54 and the drain region 55 as shown in FIG. 6C. Also in this case, the same effects as those of the second embodiment can be obtained.

Figure 7A:
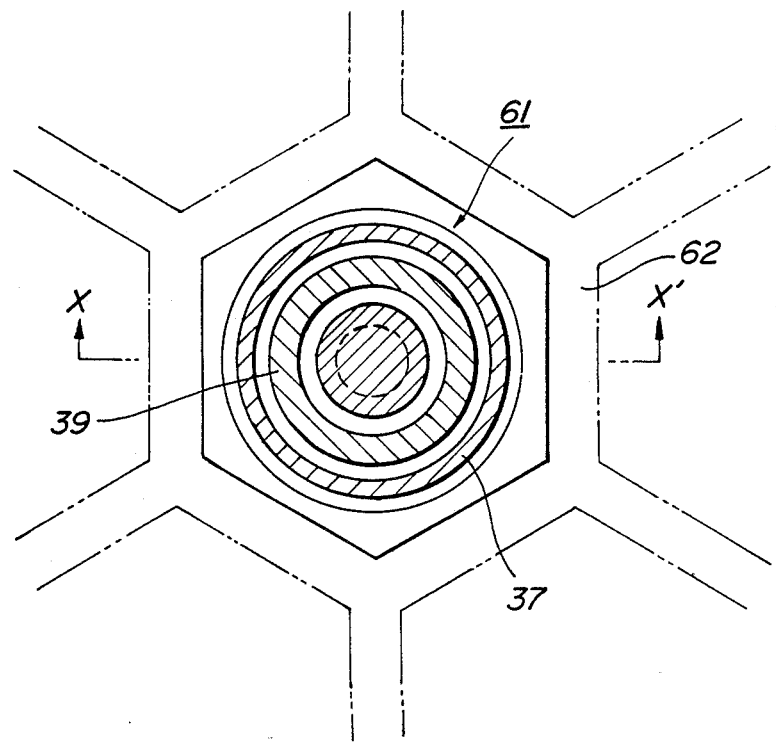
FIGS. 7A and 7B are plan and cross sectional views, respectively, illustrating a fifth embodiment of the solid state image pick-up element according to the invention.
Figure 7B:
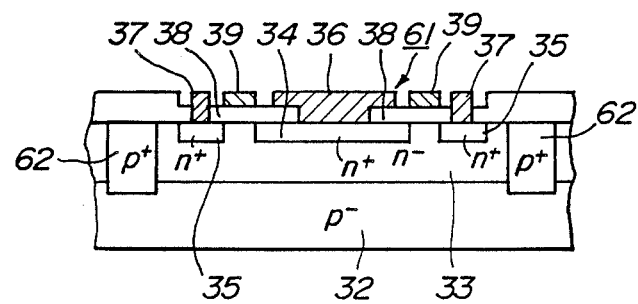

FIG. 7A is a plan view showing a fifth embodiment of the solid state image pick-up element according to the invention, and FIG. 7B is a cross sectional view cut along line X-X' of the embodiment shown in FIG. 7A. In this embodiment, the solid state image pick-up element 61 is constructed the same as that of the second embodiment shown in FIGS. 4A and 4B except that an isolation region 62 is formed by a hexagonal $p^+$ diffusion layer of an opposite conductivity type which extends from a surface of the $n^-$ epitaxial layer 33 consisting of the channel region to the substrate 42, and thus portions in FIGS. 7A and 7B similar to those shown in FIGS. 4A and 4B are denoted by the same reference numerals as used in FIGS. 4A and 4B.

In this embodiment, since the isolation region 62 is constructed by a diffusion layer, it is possible to suppress a leak current between adjacent pixels more stably and to manufacture this element more easily as compared with the embodiment which utilizes an isolation region of a semiconductor oxide or an insulating material. Moreover, in the embodiment shown in FIGS. 7A and 7B, use is made of an isolation region 62 made of a $p^+$ diffusion layer which extends from the surface of the epitaxial layer 33 to the substrate 32. It is, however, not always necessary to extend the isolation region 62 to the substrate 32.

Figure 8A:
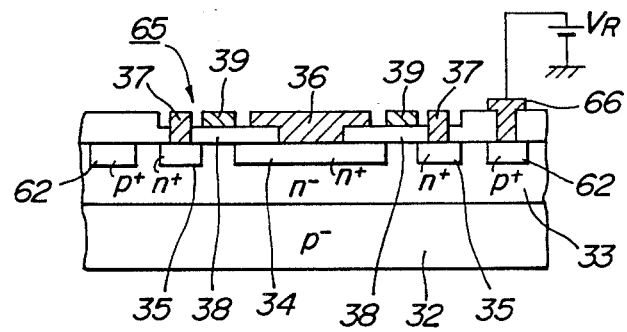
FIGS. 8A, 8B and 8C are cross sectional views, respectively, depicting sixth, seventh and eighth embodiments of the solid state image pick-up element according to the invention.

FIG. 8A is a cross sectional view showing a sixth embodiment of the solid state image pick-up element according to the invention. In this embodiment, the solid state image pick-up element 65 is the same as that described in the fifth embodiment except that the isolation region 62 made of a $p^+$ diffusion layer does not extend up to the substrate 32 from the surface of the epitaxial layer 33. In this case, if a suitable inverse bias $V_R$ with respect to the epitaxial layer 33 is applied to the isolation region 62 through the electrode 66, a depletion layer extending to the substrate 32 is generated beneath the isolation layer 62 and thus adjacent pixels are electrically isolated from each other.

According to the embodiment mentioned above, the same effects as those of the fifth embodiment can be obtained. Further, since the isolation region 62 does not extend to the substrate 32, it is possible to reduce the area of the solid state image pick-up element by three to five times as compared with the fifth embodiment in which the isolation region extends to the substrate 32. Therefore, the size of the pixel can be made smaller and an integration thereof can be advantageously effected.

Moreover, the above-mentioned construction, such that the isolation region is formed by the diffusion method, can be applied in the same manner to the LSIT disclosed in Japanese patent application No. 245,059/83 and the other solid state image pick-up elements according to the invention. Further, in the case where the source region or the drain region are formed at the outermost portion as shown in the second embodiment and the fourth embodiment, the isolation region may be constructed by the source or drain regions.

Figure 8B:
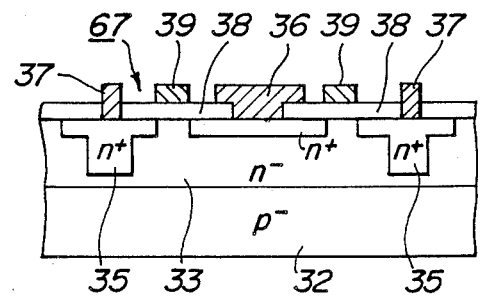
Figure 8C:
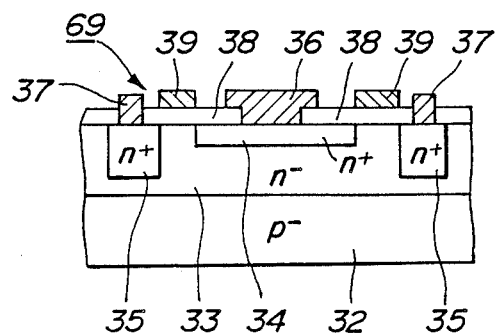

FIG. 8B is a cross sectional view showing a seventh embodiment of the solid state image pick-up element according to the invention. In this embodiment, the solid state image pick-up element 67 is the same as that described in the second embodiment except that the drain region 35 is also used as the isolation region by providing a deeply extending portion in the n+ drain region 35. Moreover, FIG. 8C is a cross sectional view showing an eighth embodiment of the solid state image pick-up element according to the invention. In this embodiment, the solid state image pick-up element 69 is the same as that described in the second embodiment except that the drain region 35 is also used as the isolation region by providing a deeper n+ drain region 35.

In the embodiments mentioned above, since a portion of or the entire drain region 35 extends deeply, the drain region 35 can be utilized as an isolation region between adjacent pixels, so that an integration of the solid state image pick-up element can be advantageously effected and the solid state image pick-up element can be manufactured easily. Further, the above-mentioned construction, such that the drain region is also used as the isolation region, can be applied advantageously to the fourth embodiment having the JGLT construction. In addition, even in the case where the source region is arranged at the outermost portion, the source region may be utilized as the isolation region in the same manner as mentioned above.

Figure 1:
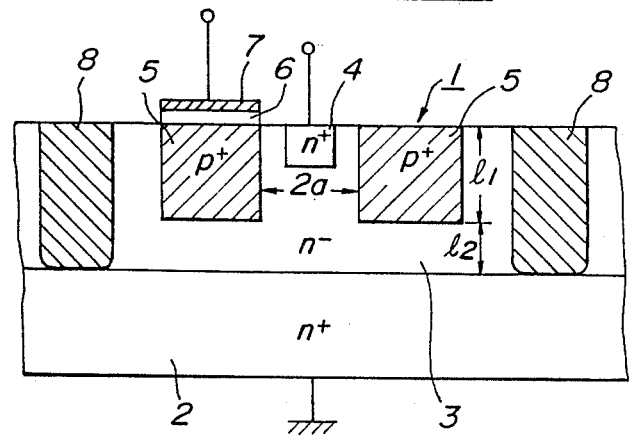
FIG. 1 is a cross sectional view showing SIT having a vertical type construction.
Figure 2:
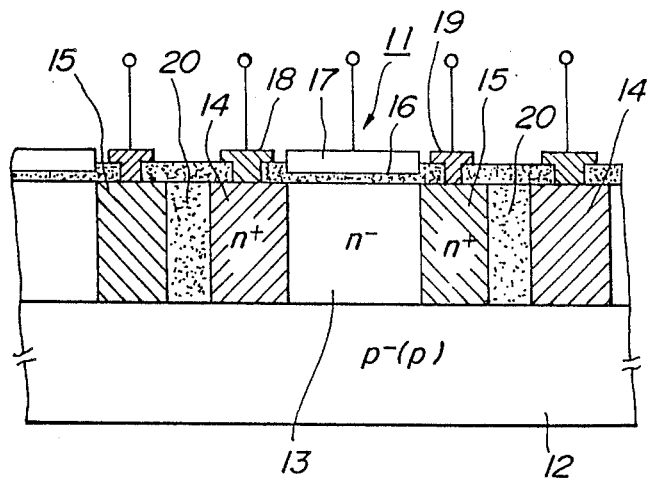
FIG. 2 is a cross sectional view showing a known lateral type SIT which is applicable to a solid state image sensor according to the invention.

In the first, second, fifth to eighth embodiments and the embodiment having the IGLT construction shown in FIG. 2, it is possible to form a gate region having an opposite conductivity type to the epitaxial layer in a surface of the epitaxial layer connected to the gate insulating film.

Figure 9A:
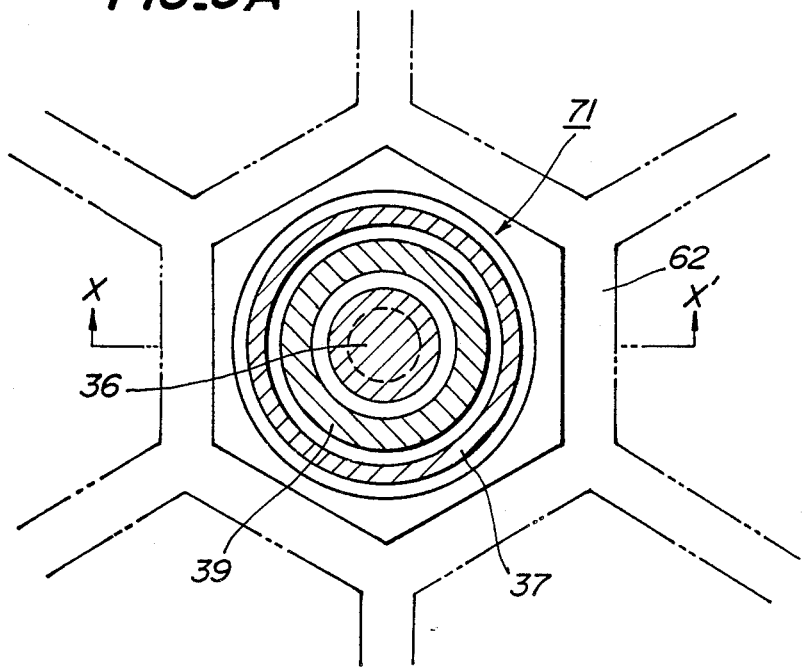
FIGS. 9A and 9B are plan and cross sectional views, respectively, showing a ninth embodiment of the solid state image pick-up element according to the invention.
Figure 9B:
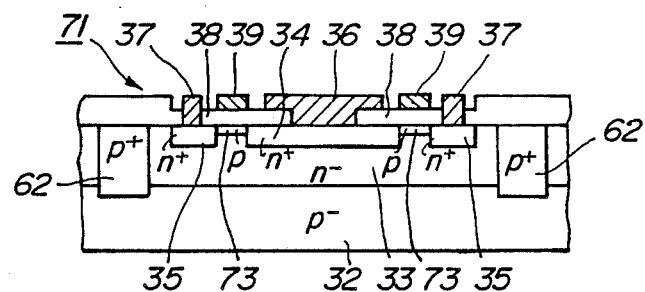
Figure 10:
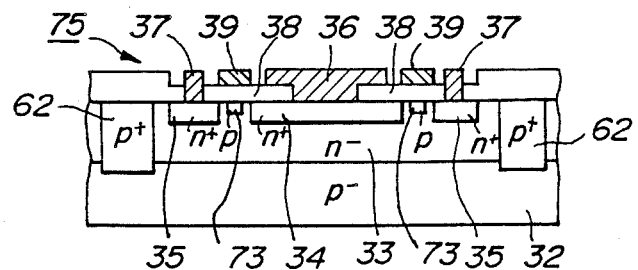
FIG. 10 is a cross sectional view illustrating a tenth embodiment of the solid state image pick-up element according to the invention.

FIG. 9A is a plan view showing a ninth embodiment of the solid state image pick-up element according to the invention, and FIG. 9B is a cross sectional view cut along line X-X' line of the embodiment shown in FIG. 9A. In this embodiment, the solid state image pick-up element 71 has a similar construction to that described in the fifth embodiment using the IGLT shown in FIGS. 7A and 7B and a p gate region 73 is formed by an ion injection method in the surface of the n− epitaxial layer 33 between the n+ source region 34 and the n+ drain region 35 and is connected to the gate insulating film 38. Moreover, FIG. 10 is a cross sectional view showing a tenth embodiment of the solid state image pick-up element according to the invention. In this embodiment, the solid state image pick-up element 75 has a construction similar to that of the IGLT shown in FIGS. 7A and 7B and the p gate region 73 is formed by an ion injection method in a portion of the surface of the n− epitaxial layer 33 between the source and drain regions 34 and 35 and is connected to the gate insulating film 38.

In the embodiments mentioned above, since the gate region is arranged on the surface of the semiconductor layer formed just beneath the gate insulating film and has an opposite conductivity with respect to the semiconductor layer, it is possible to make the saturation amount of light larger. In addition, especially in the case where the gate region is formed along a region between the source region and the drain region as shown in the ninth embodiment, it is possible to effect a so-called self-alignment process in the source, gate and drain positions, which cannot be effected in the JGLT construction.

In the IGLT and JGLT constructions mentioned above, the source region and the drain region may be formed concentrically with each other and then they may be completely surrounded by the gate region, as was described in the first and third embodiments.

Figure 11A:
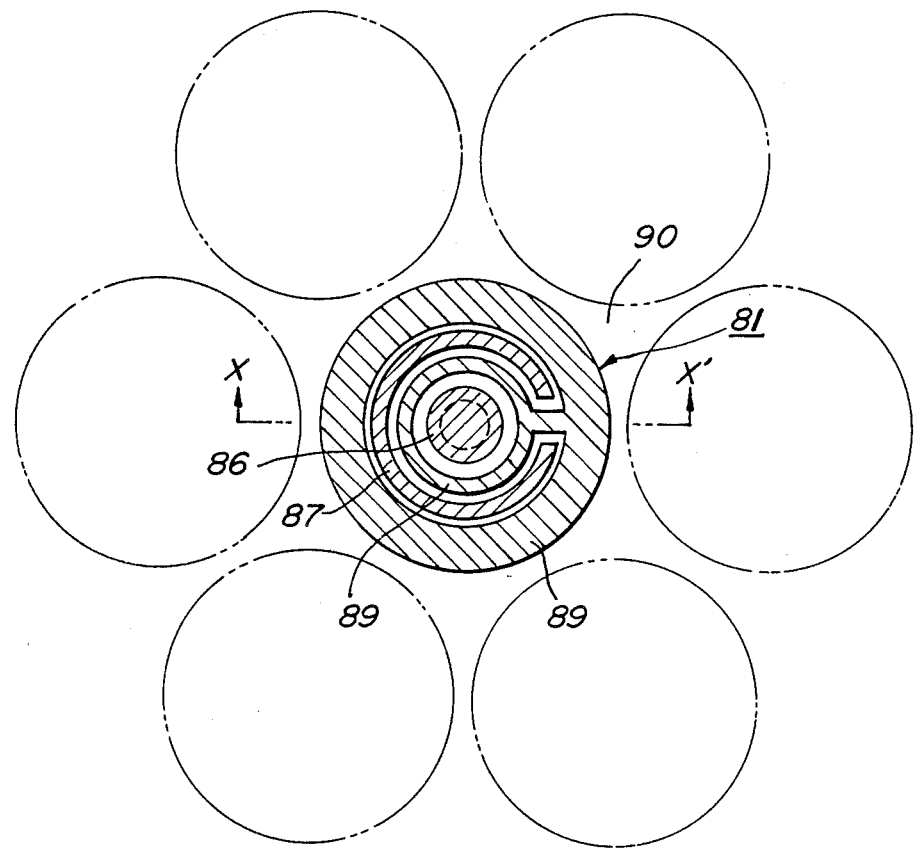
FIGS. 11A and 11B are plan and cross sectional views, respectively, depicting an eleventh embodiment of the solid state image pick-up element according to the invention.
Figure 11B:
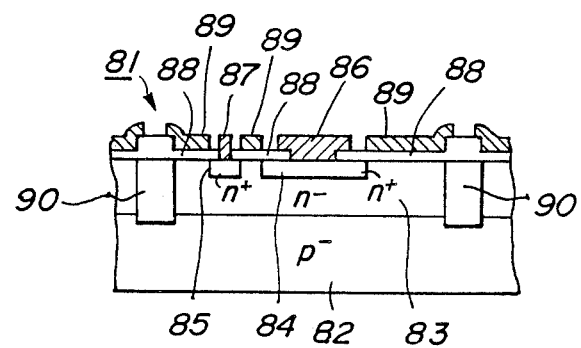

FIG. 11A is a plan view showing an eleventh embodiment of the solid state image pick-up element according to the invention, and FIG. 11B is a cross sectional view cut along line X-X' of the embodiment shown in FIG. 11B. In this embodiment, the solid state image pick-up element 81 has an IGLT construction in which the source region and the drain region are formed concentrically with each other and are completely surrounded by the gate region. That is, an n− epitaxial layer 83 consisting of a channel region is formed on a p− substrate 82, and in the epitaxial layer 83 are formed an n+ circular source region 84 and an n+ ring-shaped drain region 85 having a cut-out portion by the addition of n type impurities. Moreover, a source electrode 86 and a drain electrode 87 both made of Al are arranged respectively on the source region 84 and the drain region 85, and a gate electrode 89 made of transparent conductive material such as $SnO_2$, ITO, etc. is arranged on a surface of the epitaxial layer 83 through a gate insulating film 88 in such a manner that the source region 84 and the drain region 85 are completely surrounded thereby through the cut-out portion of the drain region 85 so as to generate a concentric insulating gate. In this embodiment, a plurality of IGLTs 81 are arranged at the vertexes of a triangle in the substrate 82, and adjacent pixels each consisting of one IGLT are electrically isolated by an isolation region 90 made of semiconductor oxide, insulating material, etc. which extends from the surface of the epitaxial layer 83 to the substrate 82.

In the present embodiment, the same effects as described in the first embodiment can be obtained. In addition, since the source region 84 and the drain region 85 are formed in a concentric manner, a variation of properties between pixels can be minimized. Moreover, the construction mentioned above, such that the source region and the drain region are completely surrounded by the gate region in a concentric manner, can be preferably applied not only to the IGLT construction mentioned above but also to the JGLT construction.

Figure 12A:
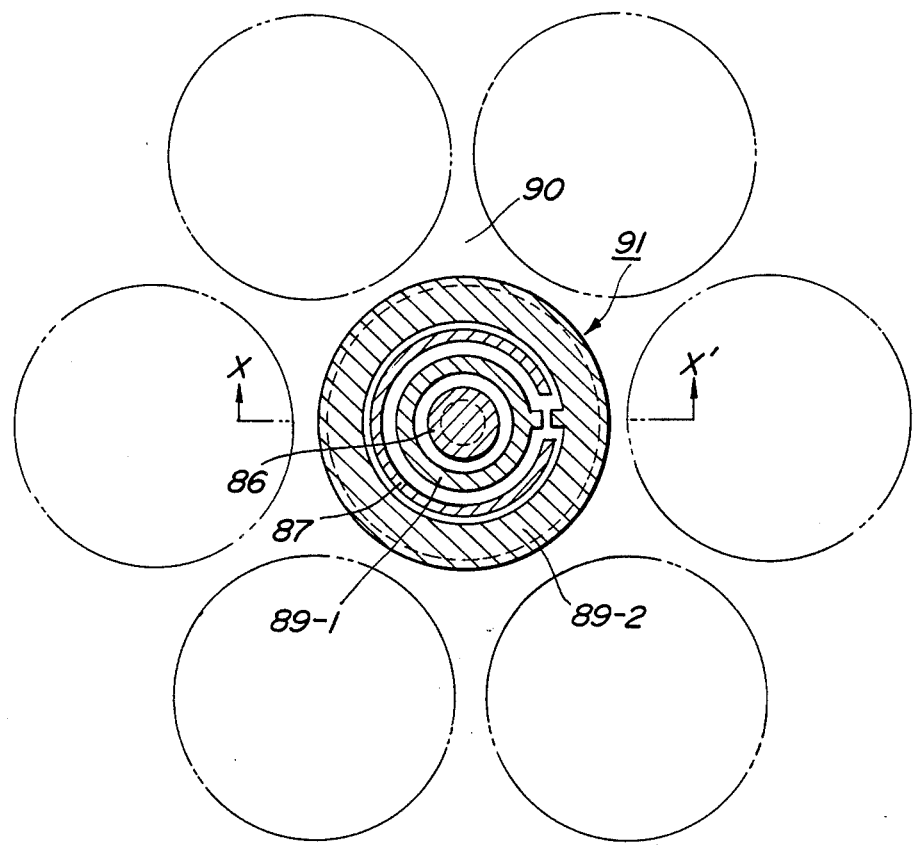
FIGS. 12A and 12B are plan and cross sectional views, respectively, showing a twelfth embodiment of the solid state image pick-up element according to the invention.
Figure 12B:
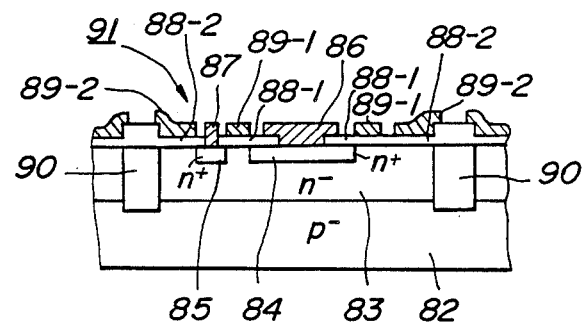

FIG. 12A is a plan view showing a twelfth embodiment of the solid state image pick-up element according to the invention, and FIG. 12B is a cross sectional view cut along X-X' of the embodiment shown in FIG. 12A. In this embodiment, the solid state image pick-up element 91 has a similar construction to that of the IGLT 81 shown in the eleventh embodiment, and the gate region arranged in the cut-out portion of the drain region 85 is removed and a first gate region surrounding the source region 84 and a second gate region surrounding the drain region 85 are separately arranged. The first and second gate regions are formed by arranging gate electrodes 89-1 and 89-2 through gate insulating films 88-1 and 88-2, respectively, in the epitaxial layer 83.

In the embodiment mentioned above using separate gate regions, a light signal charge stored in the outer second gate region can be transferred to the inner gate region serving as a current control between the source region 84 and the drain region 85 during an amplification operation, and thus it is possible to obtain a larger amplification than that possible in a single gate construction.

Figure 13A:
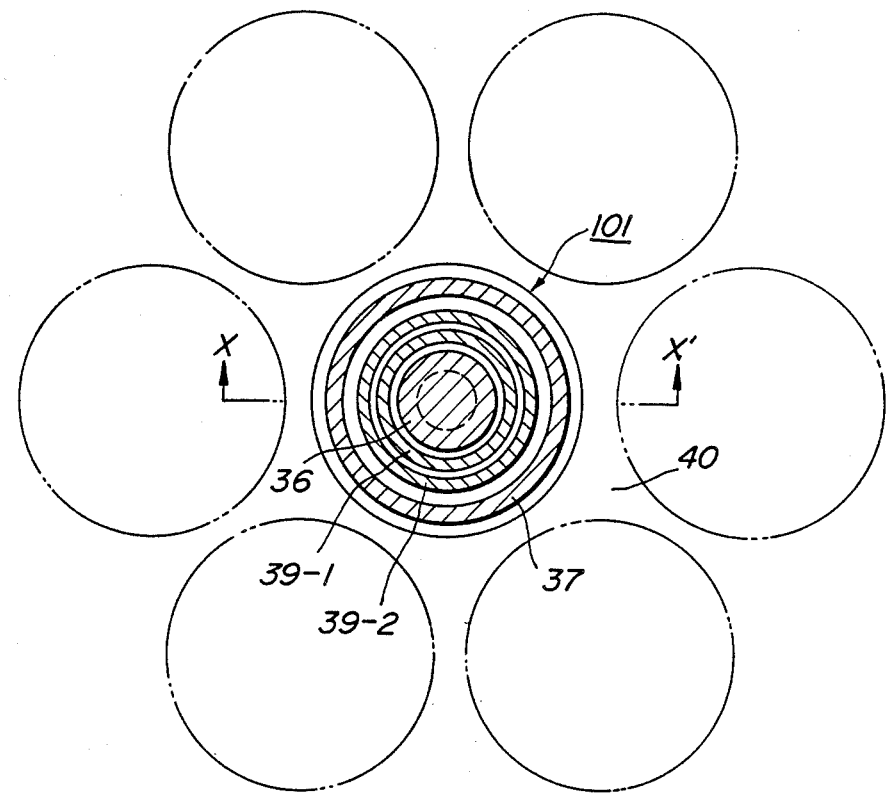
FIGS. 13A and 13B are plan and cross sectional views, respectively, illustrating a thirteenth embodiment of the solid state image pick-up element according to the invention.
Figure 13B:
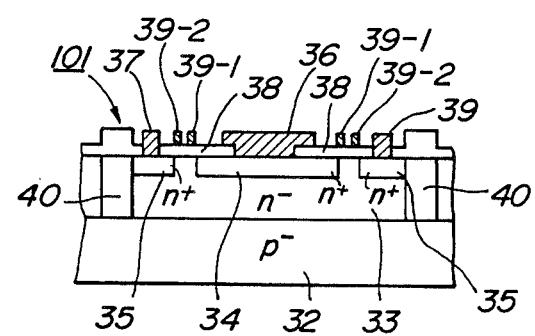

FIG. 13A is a plan view showing a thirteenth embodiment of the solid state image pick-up element according to the invention, and FIG. 13B is a cross sectional view cut along line X-X' of the embodiment shown in FIG. 13B. In this embodiment, the solid state image pick-up element 101 has a similar construction to that of the IGLT 31 shown in the second embodiment (FIGS. 4A and 4B), and a ring-shaped first gate electrode 39-1 and a ring-shaped second gate electrode 39-2 are separately arranged on the same gate insulating film 38 in a concentric manner so as to generate the first and second gate regions.

In the embodiment mentioned above, the same effects as those of the twelfth embodiment can be obtained, and further, the light signal charge transferring efficiency from the first or second gate region to the second or first gate region can be made larger.

Moreover, the constructions shown in the twelfth embodiment and the thirteenth embodiment can be advantageously applied to the JGLT construction mentioned above and the other IGLT constructions.

In each of the embodiments of the solid state image pick-up element according to the invention, the source electrode and the drain electrode are formed by a metal such as Al, but it is found by experimentation that, even if a metal electrode is used, light is received under the source region and the drain region. Therefore, the source and drain electrodes can be formed by of transparent material like that used in the gate electrode or a translucent material such as polysilicon, and thus it is possible to increase the light receiving efficiency. Moreover, in each of the embodiments mentioned above, use is made of a double layer construction such as $n^-/p^-$ or p epitaxial layer, but it is possible to obtain the IGLT or JGLT having good photoelectric converting property without using an epitaxial layer by utilizing only a $p^-$ layer as the substrate. In this case, the image pick-up element can be manufactured much easier and can be made less expensively. Further, even if only a $p^-$ layer is used as the substrate, it is possible to apply a back gate from the substrate as in the $n^-/p$ construction. In this case, since a channel current can be controlled by both the gate electrode in the surface and the substrate, it is possible to vary the photoelectric converting property in response to the substrate bias. Therefore, if the substrate bias is suitably selected, a desired photoelectric converting property can be designed freely. Furthermore, instead of $n^-$ (channel)/$p^-$ or p substrate, use may be made of $n^-$ (channel)/insulating material or $n^-$ (channel)/insulating material/Si construction. In this case, especially in the latter case, the back gate can be applied in a completely insulating condition. Moreover, in each of the embodiments mentioned above, the explanation is made to the n channel construction such that the charge that flows through all of the channel regions is an electron, but the channel region can be formed by the p channel construction. However, in this case, it is necessary to invert the polarity of the bias voltage as well as the conductivity type. Further, as for the semiconductor material, use can be made of a chemical element of the group-IV family or the group-V family in the periodic table, a bulk crystal such as a compound semiconductor of the group-III-V family or II-VI family and an amorphous thereof.

Hereinafter, the operation and the properties of the solid state image pick-up element according to the invention which comprises the lateral type static induction transistor (LSIT) mentioned above will be explained. As mentioned above, the type of the solid state image pick-up element according to the invention is mainly divided into the insulating gate lateral static induction transistor (IGLT) and the junction gate lateral static induction transistor (JGLT) due to the gate construction, but hereinafter the explanation is made of the IGLT type.

FIG. 14 is a perspective view showing one embodiment of the IGLT construction which corresponds to the second embodiment shown in FIG. 4. In this embodiment, an $n^-$ epitaxial layer 112 is grown on a p substrate 111, and in the epitaxial layer 112 are formed a drain region 113 consisting of an $n^+$ diffusion layer and a source region 114 also consisting of an $n^+$ diffusion layer in a concentric manner. Moreover, a gate insulating film 115 is formed on the epitaxial layer 112 between the drain region 113 and the source region 114, and on the gate insulating film 115 is formed a gate electrode 116 made of transparent conductive material so as to construct the insulating gate construction. Therefore, in this embodiment, the source region 114 is completely surrounded by the gate region. Moreover, a source voltage $V_s$, a drain voltage $V_D$, a gate voltage $V_G$ and a substrate voltage $V_{SUB}$ are applied to a source terminal 117 connected to the source region 114, a drain terminal 118 connected to the drain region 113, a gate terminal 119 connected to the gate electrode 116 and a substrate terminal 120 connected to the substrate 111, respectively.

FIG. 15 shows an equivalent circuit diagram of the solid state image pick-up element shown in FIG. 14. In this embodiment, the various specifications of the solid state image pick-up element will be given below. The substrate 111 is made of silicon, whose p type impurity concentration is $1 \times 10^{12}$ atom/cm$^3$, and the epitaxial layer 112 consisting of the channel is also made of silicon, whose n type impurity concentration is $7 \times 10^{12}$ atom/cm$^3$. Moreover, the thickness of the channel $d_2 + d_3$ is 4 to 10 $\mu$m, a diffusion depth $d_2$ of the source region 114 is 0.5 $\mu$m, a thickness $d_1$ of the gate insulating film 115 made of silicon oxide is 800 Å, a diameter $l_1$ of the circular source region 114 is 3 $\mu$m, and a width $l_2$ of the ring-shaped source region is about 6 $\mu$m. In the IGLT mentioned above, it is confirmed that an area of the channel region can be sufficiently widened and a good photoelectric converting property can be obtained, since the source region is surrounded by the gate region.

Figure 16:
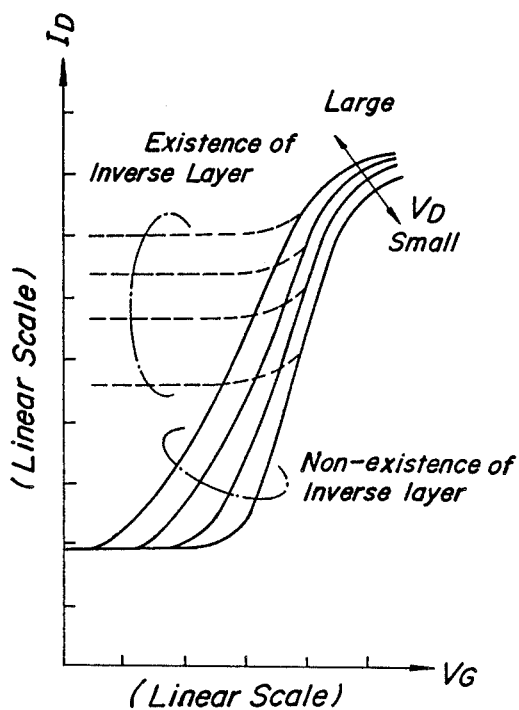
FIG. 16 is a graph illustrating the relationship between gate voltage and source-drain current as a parameter of drain voltage.

Hereinafter, properties of the solid state image pick-up element mentioned above will be explained. In a graph shown in FIG. 16, the abscissa shows the gate voltage $V_G$ applied to the gate terminal 119 by a linear scale, and the ordinate illustrates a current $I_D$ flowing between the source terminal 117 and drain terminal 118 by the linear scale. Moreover, as for the parameter of this graph, use is made of the voltage $V_D (>0)$ applied to the drain terminal 118 under the condition that the source voltage $V_s$ becomes $V_s = 0$ and the substrate voltage is negative so as to inversely bias the pn junction between the substrate 111 and the epitaxial layer 112. As clearly understood from the graph, a larger current $I_D$ flow corresponds to an increase in the drain voltage $V_D$, and also corresponds to an increase in the positive gate voltage $V_G$. In FIG. 16, a solid line shows the current $I_D$ in an unsteady state such that no inverse layer consisting of positive holes exists just beneath the gate insulating film 115, and a dotted line illustrates the current $I_D$ in a thermally stable state such that the positive hole inverse layer does exist, both under the condition that $V_s=0$ and $V_{SUB}=V_{SUB1}$ (<0).

Figure 17:
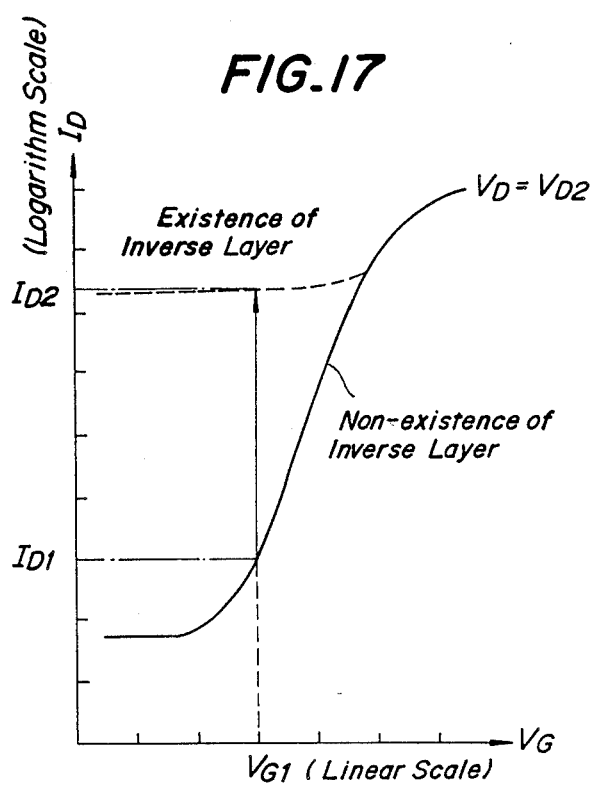
FIG. 17 is a graph depicting the relationship between gate voltage and source-drain current.

Next, the light receiving operation of the solid state image pick-up element mentioned above will be explained with reference to FIG. 17. At first, in a dark state when no light is made incident, the following conditions are initially set; source voltage $V_s=0$, the drain voltage $V_D=V_{D1}=0$, the gate voltage $V_G=V_{G1}$ (<0) and the substrate voltage $V_{SUB}=V_{SUB1}$ (<0). In this case, since the gate voltage $V_{G1}$ is applied to the gate terminal 119, a depletion layer extends over the whole channel region from a boundary between the gate insulating film 115 and the epitaxial layer 112. At this time, since the unsteady state is realized, no positive holes exist in the depletion layer. Then, when light is made incident upon the solid state image pick-up element, hole-electron pairs are generated in the depletion layer, so that the positive holes are stored in the gate region arranged in the boundary between the gate insulating film 115 and the epitaxial layer 112. In this manner, if the positive holes are stored in the boundary, the height of the potential barrier between the source and drain is decreased corresponding to the amount of holes stored herein.

After a lapse of a certain constant hole storing time, if the source and drain are biased in a forward direction by applying a positive voltage $V_{D2}$ to the drain terminal 118, the current $I_D$ flows between the source and drain regions in response to the amount of holes stored in the boundary. The current $I_D$ is larger than the dark current $I_{D1}$ flowing between the source and drain regions in the case when the holes do not exist in the boundary because no light is incident. That is, the variation of the incident light amount can be derived from the current $I_D$ flowing between the source and drain regions.

In the solid state image pick-up element according to the invention, since at least one of the source region and drain region is surrounded by the gate region, an area of the gate region i.e. that of the channel region becomes larger and thus the aperture ratio can be made larger. Therefore, the photoelectric converting efficiency can be improved and the holes, the amount of which accurately corresponds to that of incident light, can be stored stably in the gate region, so that an S/N of the current $I_D$ can be made larger.

If the light over the saturation amount of exposure is made incident during the light storing time, positive holes over the saturation amount are generated, but the holes over the saturated amount flow mainly away to the substrate 111. Therefore, in the case where the light over the saturation amount of exposure is made incident, the current $I_D$ between the source and drain is fixed to a saturation current value $I_{D2}$.

Figure 18:
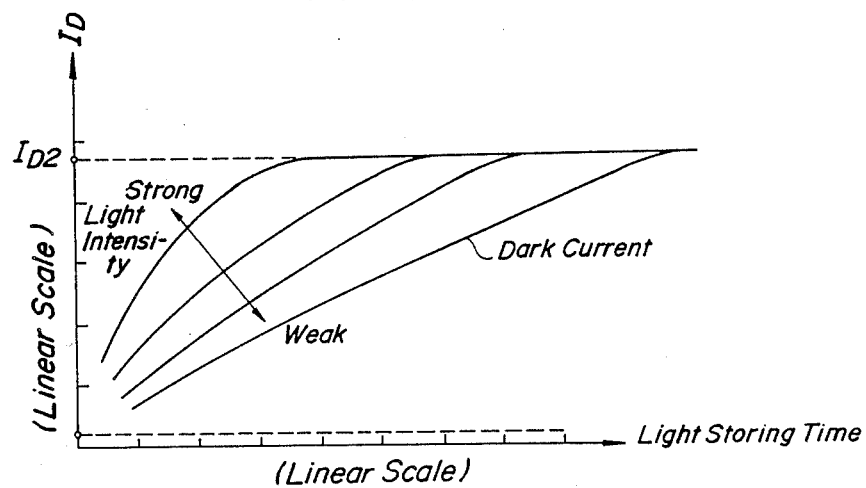
FIG. 18 is a graph showing the relationship between light storing time and source-drain current as a parameter of incident light intensity.

FIG. 18 is a graph showing the relationship between the light storing time and the source-drain current as a parameter of incident light intensity, in which the abscissa shows the light storing time by the linear scale and the ordinate illustrates the current $I_D$ between the source and drain by a linear scale. In this embodiment, the inclination of the current $I_D$ between the source and drain becomes steep corresponding to an increase in the light intensity, and becomes gentle corresponding to a decrease in the light intensity. In the dark state, the time required to reach the saturation current $I_{D2}$ is about 10 seconds and is determined by the thermal generation rate of the holes.

In the case where the solid state image pick-up element mentioned above is actually installed in a solid state image sensor, the variation of the current $I_D$ is converted mainly into that of the voltage. As to a main current-voltage converting method, the source follower and the common source method are preferably utilized. The explanation thereof will be made with reference to FIGS. 19 and 20.

Figure 19:
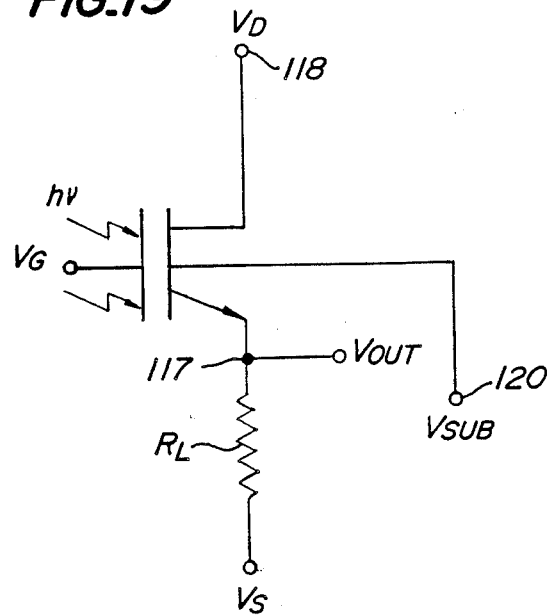
FIG. 19 is a circuit diagram showing a current-voltage converter of a source follower type.
Figure 20:
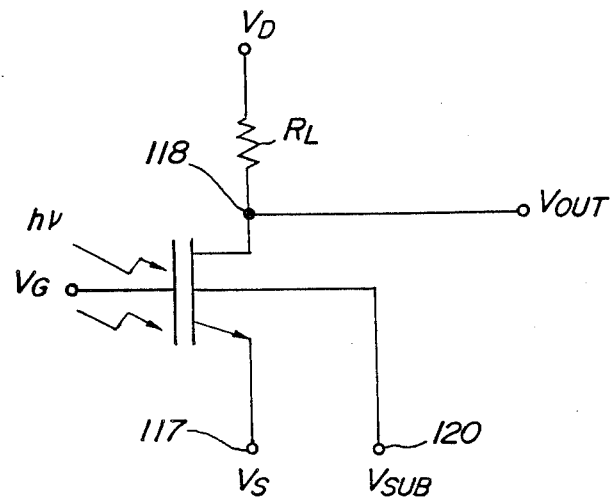
FIG. 20 is a circuit diagram illustrating a current-voltage converter of a common source type.

FIG. 19 is a circuit diagram showing a current-voltage converting method of a source follower type, in which a load resistor $R_L$ is connected to the source terminal 117 and an output voltage $V_{OUT}$ is derived from the source terminal 117. FIG. 20 is a circuit diagram showing another current-voltage converting method of a common source type, in which a load resistor $R_L$ is connected to the drain terminal 118 and an output voltage $V_{OUT}$ is derived from the drain terminal 118. In the embodiments shown in FIGS. 19 and 20, the light which is made incident upon the gate region is depicted by hv.

FIGS. 21A to 21D show timing charts of the photoelectric converting operations, in which the abscissa shows a time t and ordinates illustrate respectively the gate voltage $V_G$, the drain voltage $V_D$, the source voltage $V_s$ and the substrate voltage $V_{SUB}$. The substrate voltage $V_{SUB}$ is usually maintained in an inverse bias voltage $V_{SUB1}$ (<0) as shown in FIG. 21D, and the source voltage $V_s$ is usually kept at a ground level $V_{s1}$ (=0) as shown in FIG. 21C. Moreover, an operation cycle T includes a storing period $T_1$, a reading out period $T_2$ and a reset period $T_3$. During the storing period $T_1$, the gate voltage $V_G$ is maintained in an inverse bias voltage $V_{G1}$ (<0), and the drain voltage $V_D$ is kept at a ground level $V_{D1}$ (=0). In the biasing condition mentioned above, the positive holes generated by the incident light are stored in the gate region, but a signal output is not generated. During the reading out period $T_2$, the gate voltage $V_G$ is maintained in a reading out voltage $V_{G2}$ ($V_{G1} \leq V_{G2} < 0$), and the drain voltage $V_D$ becomes a high level $V_{D2}$ (>0), so that a signal can be read out. In FIG. 21A, the reading out voltage $V_{G2}$ is greater than that of $V_{G1}$, but it is possible to make $V_{G1}$ equal to $V_{G2}$. During the reset period $T_3$, the drain voltage $V_D$ is maintained at the high level $V_{D2}$ and the gate voltage $V_G$ becomes a forward reset voltage $V_{G3}$ (>0), so that the holes stored in the gate region are discharged. In this case it is not necessary to generate the output signal during the reset period $T_3$, the drain voltage $V_D$ may be the ground level $V_{D1}$ (−0). Moreover, as to the reset method, one or both of the source voltage $V_s$ and the drain voltage $V_D$ are forwardly biased.

Figure 22:
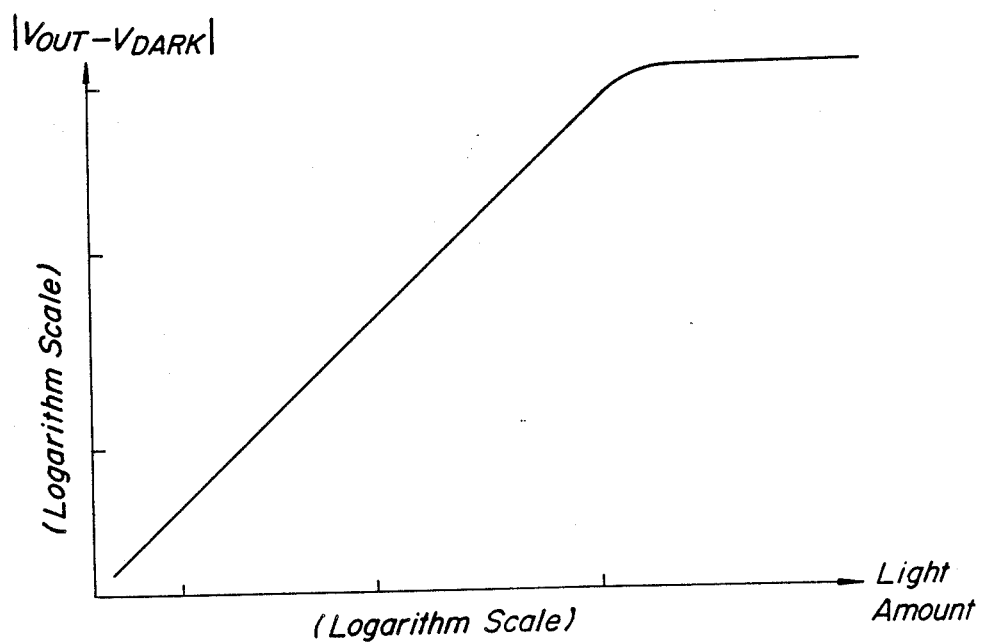
FIG. 22 is a graph showing the relationship between incident light amount and output voltage.
Figure 23:
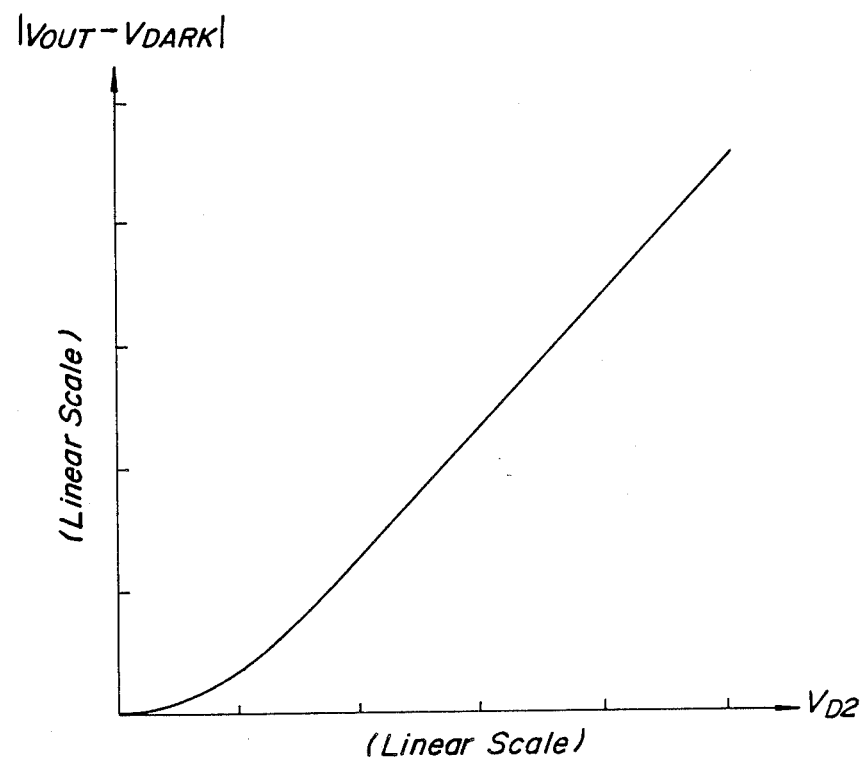
FIG. 23 is a graph illustrating the relationship between drain voltage and output voltage.
Figures 25A, 25B, 25C, 25D:
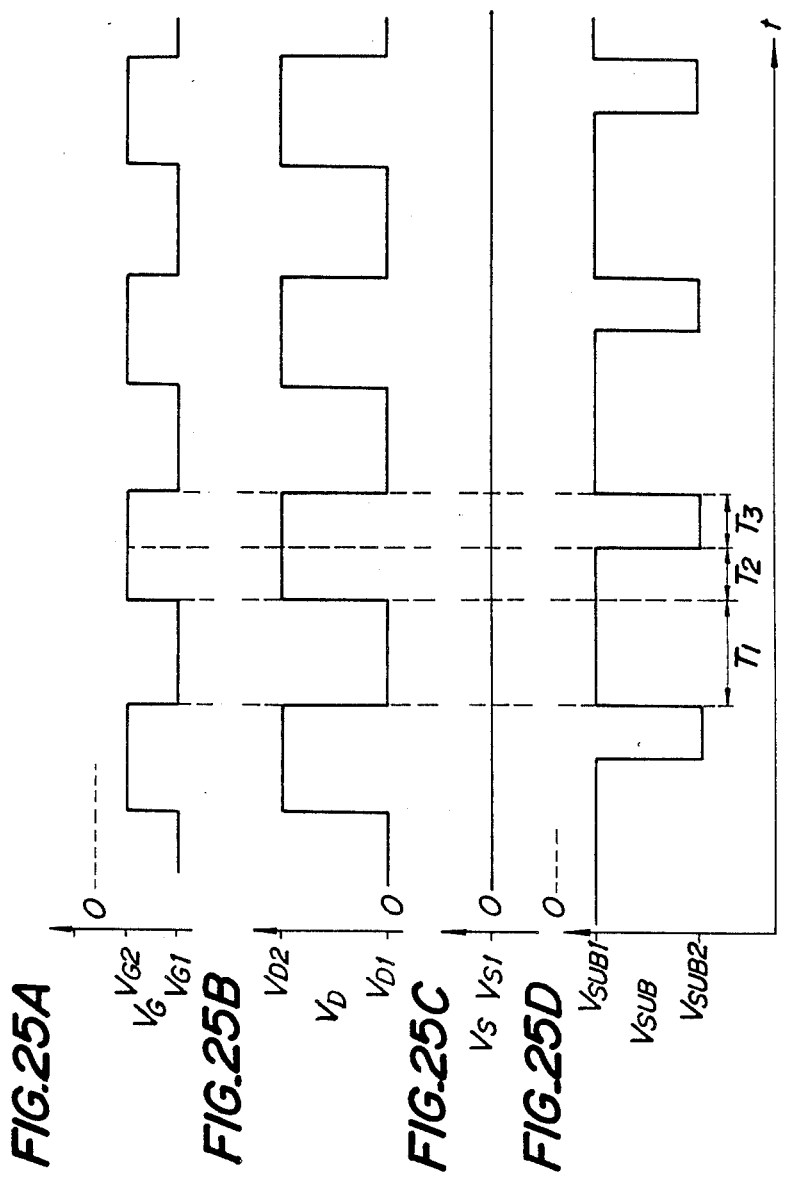
FIGS. 25A to 25D are waveforms respectively showing gate, drain, source and substrate voltages for explaining a reset operation due to the substrate voltage.

After the light storing operation is effected as mentioned above, the output signal obtained by the reading out operation will be illustrated in FIGS. 22 and 23.

FIG. 22 is a graph showing the relationship between the incident light amount and the output voltage, in which the abscissa shows the incident light on the logorithm scale and the ordinate illustrates the absolute value of the difference between the output voltage $V_{OUT}$ in the case of the light incidence condition and the output voltage $V_{DARK}$ in the case of the dark condition, i.e. $|V_{OUT}-V_{DARK}|$ on the logarithm scale. As clearly understood from FIG. 12, it is experimentally confirmed that a good tone such as $\gamma \cong 1$ can be obtained.

FIG. 23 is a graph showing the relationship between the drain voltage $V_{D2}$ and the value $|V_{OUT}-V_{DARK}|$, in which the abscissa shows the drain voltage $V_{D2}$ on a linear scale and the ordinate illustrates the value $|V_{OUT}-V_{DARK}|$ on a liner scale in the same manner as the embodiment shown in FIG. 22. As clearly understood from FIG. 23, it is experimentally confirmed that the output voltage becomes larger, corresponding to an increase of the drain voltage $V_{D2}$, and this relationship has good linearity. Moreover, in the solid state image pick-up element according to the invention, it is experimentally confirmed that the factors such as saturation amount of exposure, sensitivity, and tone ($\gamma$) can be varied by adjusting the gate voltage $V_G$, the source of voltage $V_s$, the drain voltage $V_D$ and the substrate voltage $V_{SUB}$.

Figure 21:
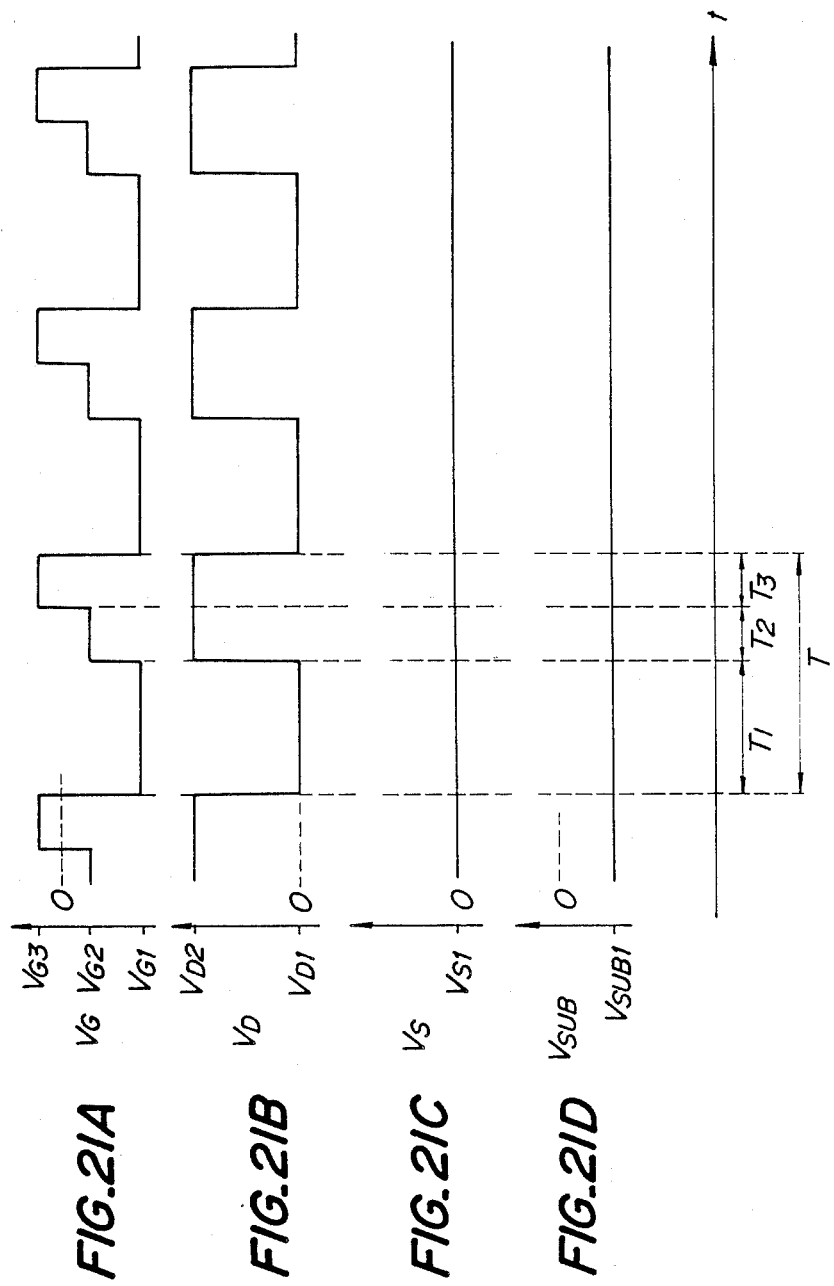
FIGS. 21A to 21D are waveforms respectively depicting gate, drain, source and substrate voltages during a storing or reading out period.

The operation method of the solid state image pick-up element according to the invention is not limited to the embodiment shown in FIG. 21, and other operation methods may be utilized. For example, in order to maintain the condition that no output signal is generated during the storing period $T_1$, it is possible to set the source voltage $V_s$ to a high level $V_{s2}=V_{D2}(>0)$ during the storing period $T_1$. Next, operation timing charts will be explained with reference to FIGS. 24A to 24C.

In FIGS. 24A to 24C, the abscissa shows a time t and ordinates illustrate the gate voltage $V_G$, the drain voltage $V_D$ and the source voltage $V_s$, respectively. In this case, the substrate voltage $V_{SUB}$ has a constant value and $V_{SUB}<0$. During the storing period $T_1$, the gate voltage $V_G$ becomes the inverse bias voltage $V_{G1}(<0)$, and the drain voltage $V_D$ and the source voltage $V_s$ becomee the high level $V_{s2}=V_{D2}(>0)$, so that no signal is generated even if the light is made incident. During the reading out period $T_2$, gate voltage $V_G$ is set to the reading out voltage $V_{G2}$ ($V_{G1} \leq V_{G2}<0$), and the source voltage $V_s$ is set to the low level $V_{s1}(=0)$, so that the signal corresponding to the incident lihght amount can be readout. Moreover, during the reset period $T_3$ the gate voltage $V_G$ is set to the forward reset voltage $V_{G3}(>0)$, so that the stored holes are discharged from the gate region arranged just beneath the gate electrode. In the embodiment shown in FIGS. 24A to 24C, during the reset period $T_3$, the drain voltage $V_D$ and the source voltage $V_s$ are set to $V_{s1}=V_{D1}(=0)$ so as to generate no signal, but, in the case that it is not necessary to stop the signal generation during the reset period $T_3$, the drain voltage $V_D$ may be set to the high level $V_{D2}$. Further, in the case that the forward reset voltage $V_{G3}$ may be made larger, it is possible to set the drain voltage $V_D$ to the high level $V_{D2}$ and the source voltage $V_s$ to the high level $V_{s2}$. In the embodiment shown in FIGS. 24A to 24C, since the source voltage $V_s$ is set to the high level $V_{s2}$ during the storing period $T_1$, the photoelectric converting efficiency and the hole storing efficiency can be improved.

As mentioned above, since the reset operation functions to discharge the positive holes from the region just beneath the gate electrode, it is possible to effect the reset operation even if the substrate voltage $V_{SUB}$ is varied. Hereinafter, such an embodiment will be explained with reference to FIGS. 25A to 25D.

In FIGS. 25A to 25D, the abscissa shows a time t and ordinates illustrate the gate voltage $V_G$, the drain voltage $V_D$, the source voltage $V_s$ and the substrate voltage $V_{SUB}$, respectively. In this embodiment, if the substrate voltage $V_{SUB}$ is set to $V_{SUB2}(<0)$ during the reset period $T_3$, the positive holes stored just beneath the gate can be compulsorily discharged to the substrate. In this method, since use is made of only two gate voltages $V_{G1}$ and $V_{G2}$, a driving circuit may be made simple in construction. Moreover, since the reset operation can be performed only by varying the substrate voltage $V_{SUB}$, the reset operation for all the chips can be effected at one time.

Figure 26:
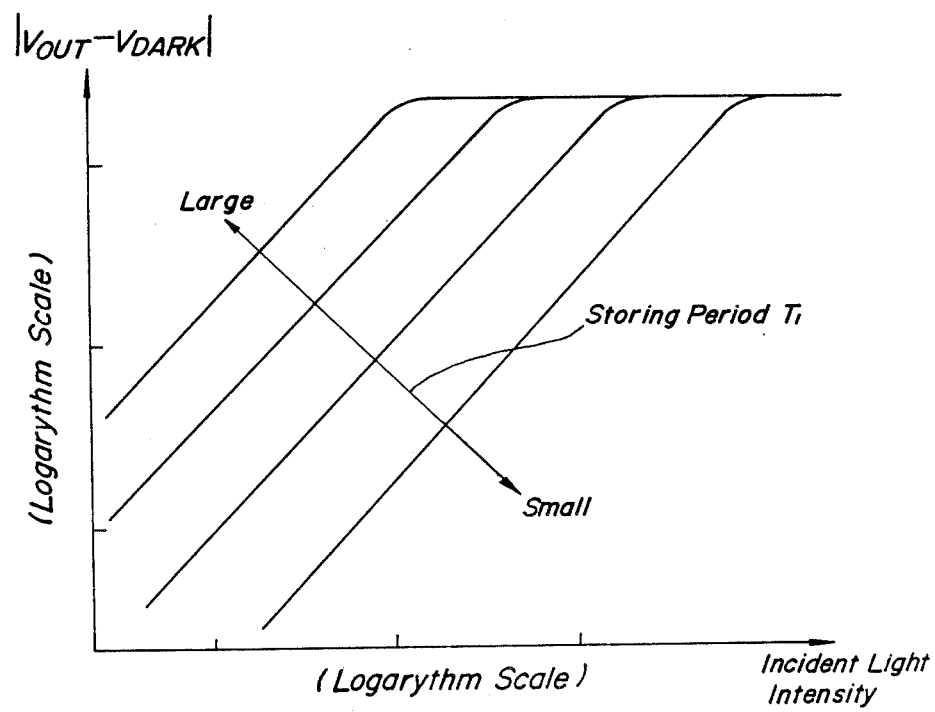
FIG. 26 is a graph illustrating the relationship between incident light intensity and output voltage as a parameter of storing time.

As to a method for effecting a most suitable light receiving operation with respect to a certain incident light intensity, there has been proposed a method for varying the storing period $T_1$. FIG. 26 is a graph showing the relationship between incident light intensity and output voltage as a parameter of the storing period $T_1$, in which the abscissa shows the incident light intensity on the logarithm scale and the ordinate illustrates the output $|V_{OUT}-V_{DARK}|$. As that described in embodiment shown in FIG. 18, the output becomes small in the case when the incident light intensity is weak, but the output also becomes smaller with respect to the same incident light intensity corresponding to a decrease of the storing period $T_1$ as shown in FIG. 26. Therefore, if the incident light intensity is detected and the storing period $T_1$ is determined correspondingly, the most suitable light exposure can be obtained in such a manner that the storing period $T_1$ is shortened in the case of when there is a large incident light intensity and also the storing period $T_1$ is made longer in case of the small incident light intensity.

Figure 27:
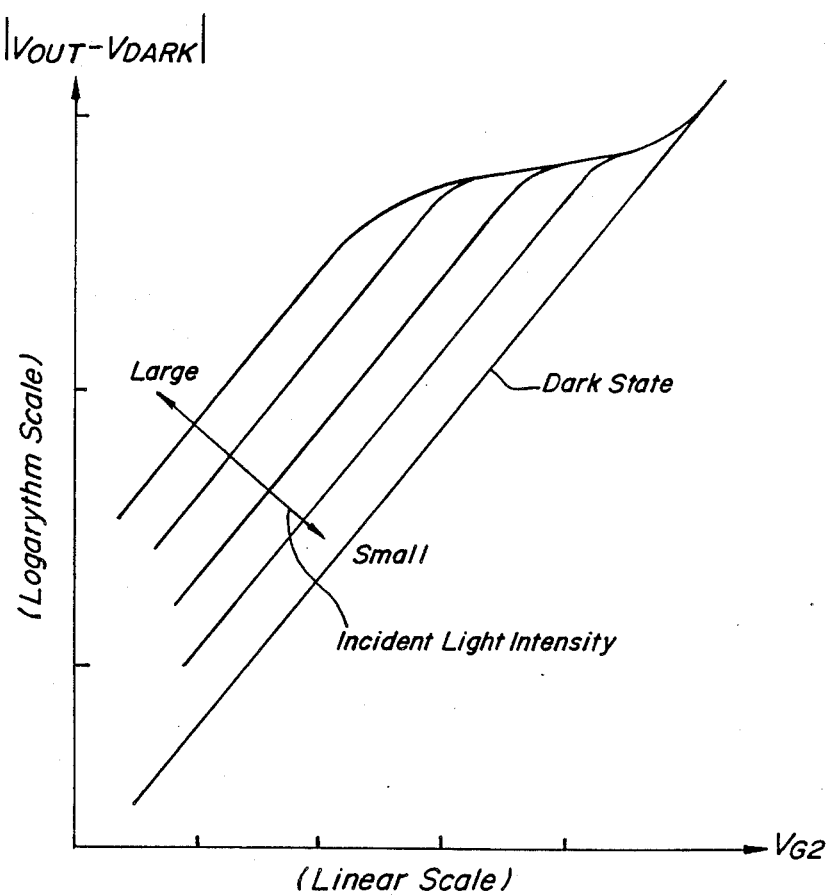
FIG. 27 is a graph depicting the relationship between gate voltage and output voltage as a parameter of incident light intensity.

Also, in order to realize the most suitable light exposure, it is possible to vary the gate voltage $V_{G2}$. FIG. 27 is a graph showing the relationship between gate voltage and output voltage as a parameter of the incident light intensity, in which the abscissa shows the reading out gate voltage $V_{G2}$ on the linear scale, and ordinate illustrates the output voltage $|V_{OUT}-V_{DARK}|$ on the logarithm scale. In this embodiment, the output voltage becomes smaller corresponding to a decrease in the gate voltage $V_{G2}$ and also to a decrease of the incident light intensity, and the output voltage is quickly saturated in the case when the gate voltage $V_{G2}$ becomes large and the incident light becomes strong. Therefore, if the incident light intensity is detected and the reading out operation is effected in such a manner that the gate voltage $V_{G2}$ is made larger in the case of a small incident light intensity and is made smaller in the case of a large incident light intensity, it is possible to always realize the most suitable light receiving operation. Further, if the gate voltage $V_{G1}$ or the substrate voltage $V_{SUB1}$ is varied during the storing period $T_1$, it is apparent that good light exposure can be obtained over a much more wide range.

In the embodiments mentioned above, explanation is made of an IGLT having the insulating gate construction, but it is a matter of course that the same explanation can be preferably applied to the JGLT having the gate diffusion region through the capacitor.

Next, the solid state image sensor according to the invention will be explained. In the solid state image sensor, a plurality of the solid state image pick-up elements are arranged in a matrix manner, and an image signal is derived from the solid state image pick-up elements by a raster scanning operation. As for the raster scanning operation, use is made of a drain-gate selection method, a source-gate selection method and a source-drain selection method. Hereinafter, these methods will be explained.

Figure 28:
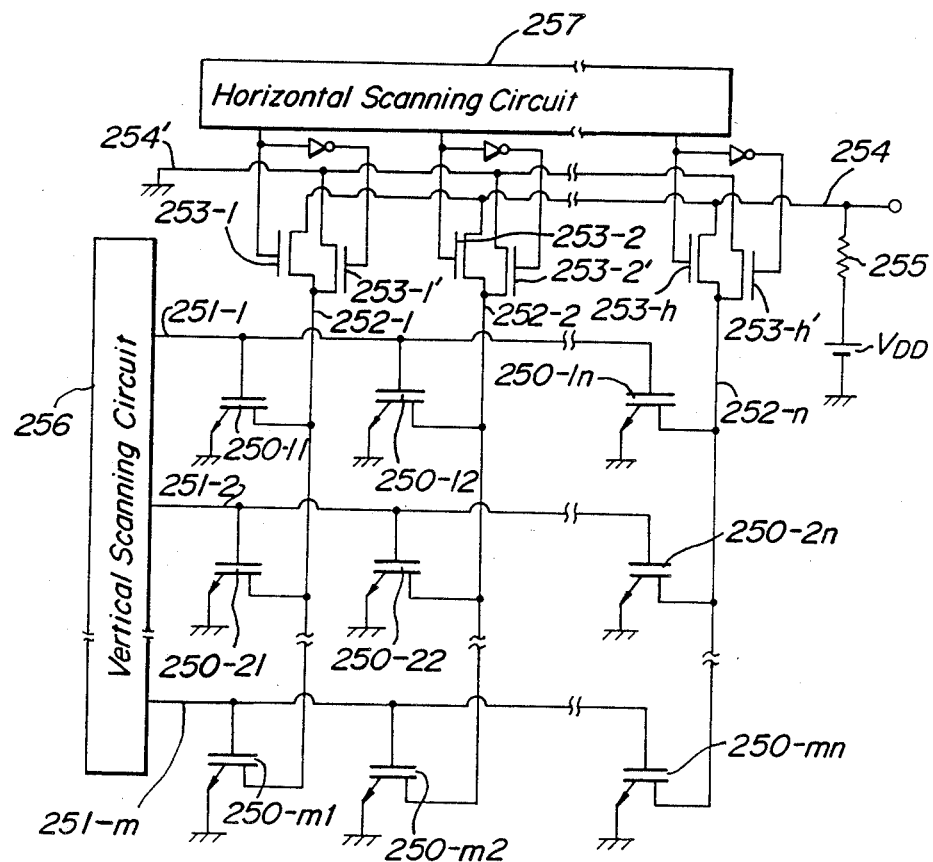
FIG. 28 is a circuit diagram showing a first embodiment of the solid state image sensor according to the invention in which the selection of a solid state image pick-up element is performed due to the gate and drain voltages.

In a first embodiment of the solid state image sensor shown in FIG. 28, m×n LSITs 250-11, 250-12, ..., 250-21, 250-22, ..., 250-mn are arranged in a matrix manner, and successive signals are derived from the LSITs 250-11 to 250-nm by the XY address method. As for the LSIT consisting of each pixels, use is made of not only the lateral static induction transistor in which at least one of the source and drain regions is surrounded by the gate region as shown in FIGS. 3 to 13, but also the lateral static induction transistor in which the gate region is arranged between the source and the drain regions as shown in FIG. 2. In this embodiment, a source terminal of respective LSITs is connected to the ground, and gate terminals of respective rows of LSITs arranged in X direction are respectively connected to row lines 251-1, 251-2, . . . , 251-m. Further, drain terminals of respective columns of LSITs arranged in Y direction are respectively connected to column lines 252-1, 252-2, . . . , 252-n, and these column lines are respectively connected to a video line 254 and a ground line 254' through column selection transistors 253-1, 253-2, . . . , 253-n and 253-1', 253-2', . . ., 253-n', respectively. To the video line 254 is connected a video power source $V_{DD}$ through a load resistor 255. The row lines 251-1, 251-2, . . . , 251-m are connected to a vertical scanning circuit 256, and signals $\phi_{G1}, \phi_{G2}, \ldots, \phi_{Gm}$ are successively supplied thereto. Moreover, the gate terminals of the column selection transistors 253-1, 253-2, . . . , 253-n and 253-1', 253-2', . . . , 253-n' are connected to a horizontal scanning circuit 257 through which signals $\phi_{D1}, \phi_{D2}, \ldots, \phi_{Dn}$ and inverse signals thereof are supplied thereto respectively.

Figure 29:
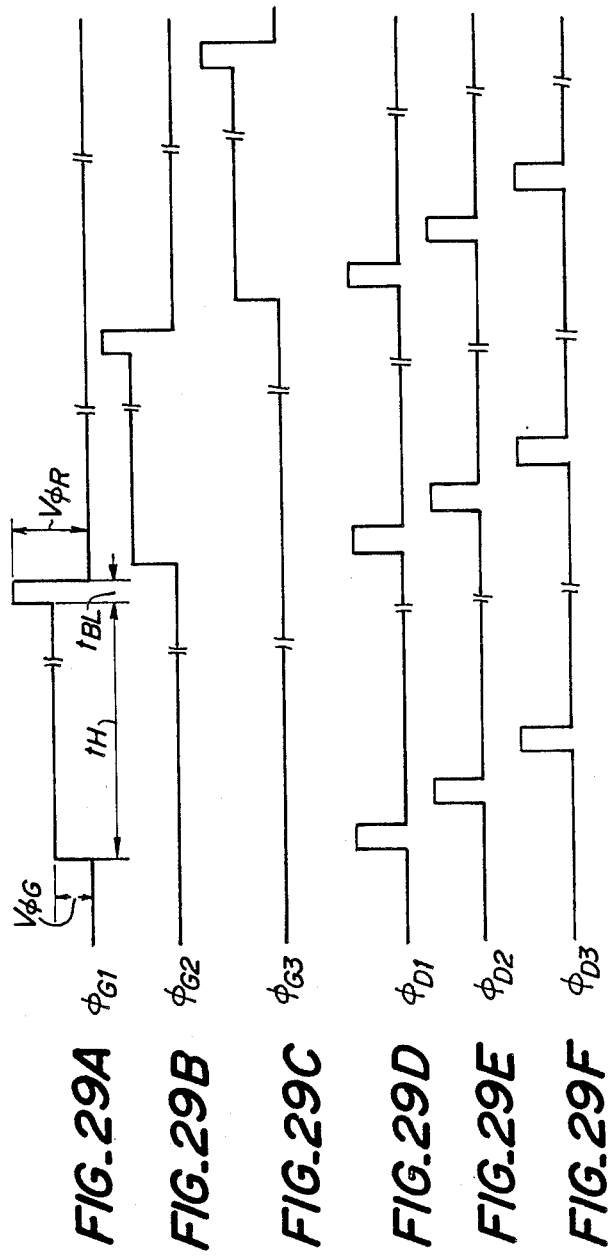
FIG. 29A to 29F are waveforms for respectively explaining the operation of the solid state image sensor shown in FIG. 28.

Next, to operation of the solid state image sensor of this embodiment will be explained with reference to FIGS. 29A to 29F. FIGS. 29A to 29F show vertical scanning signals $\phi_{G1}, \phi_{G2}, \phi_{G3}$ and horizontal scanning signals $\phi_{D1}, \phi_{D2}, \phi_{D3}$, respectively. Each signals $\phi_{G1}, \phi_{G2}, \ldots$ applied to the row lines 251-1, 251-2, . . . consists of a reading out gate voltage $V_{\phi G}$ having a small amplitude and a reset gate voltage $V_{\phi R}$ having a larger amplitude than that of the $V_{\phi G}$. The value of each signals $\phi_{G1}, \phi_{G2}, \ldots$ is maintained in the $V_{\phi G}$ during one line scanning period $t_H$, and is set to the $V_{\phi R}$ during a horizontal blanking period $t_{BL}$ from the end of one line scanning period to the start of the next scanning period, as shown in FIGS. 29A to 29C. The horizontal scanning signals $\phi_{D1}, \phi_{D2}, \ldots$ applied to the gate terminals of the column selection transistors function to select the column lines 252-1, 252-2, . . . , respectively in such a manner that a low level of this signal makes the column selection transistors 253-1, 253-2, . . . , off and the inverse selection transistors 253-1', 253-2', . . . , on, and a high level of this signal makes the column selection transistors on and the inverse selection transistors off.

Hereinafter, the operation of the solid state image sensor shown in FIG. 28 will be explained with reference to the waveforms shown in FIGS. 29A to 29F on the basis of the operation of the LSIT mentioned above. When the signal $\phi_{G1}$ becomes the value $V_{\phi G}$ as shown in FIG. 29A by means of the vertical scanning circuit 256, the LSITs 250-11, 250-12, . . . , 250-1n connected to the row line 251-1 are selected, and the horizontal selection transistors 253-1, 253-2, . . . , 253-n are successively turned on by means of the signals $\phi_{D1}, \phi_{D2}, \ldots$ supplied from the horizontal scanning circuit 257 as shown in FIGS. 29D to 29F, so that the signals generated in the LSITs 250-11, 250-12, . . . , 250-1i n are successively outputted from the video line 254. Then, if the signal $\phi_{G1}$ becomes the high level $V_{\phi R}$, these LSITs 250-11, 250-12, . . . , 250-1n are reset to the same time so as to prepare the next light receiving operation. Next, when the signal $\phi_{G2}$ becomes the value $V_{\phi G}$ as shown in FIG. 29B, the LSITs 250-21, 250-22, . . . , 250-2n connected to the row line 251-2 are selected, and the light signals generated in the LSITs 250-21, 250-22, . . . , 250-2n are read out successively by means of the horizontal scanning signals $\phi_{D1}, \phi_{D2}, \ldots$ . Then, if the signal $\phi_{G2}$ becomes the value $V_{\phi R}$, all the LSITs 250-21, 250-22, . . . , 250-2n are reset simultaneously. After that, the light signals of the LSITs are read out successively in this manner and video signals representing one field can be thus obtained.

In the first embodiment mentioned above, the inverse selection transistors 253-1', 253-2', . . . , 253-n' function to set the drain terminals of the non-selected LSITs to the ground potential. However, since the light signal can be stored in the gate region even if the these inverse transistors are not utilized, it is possible to remove the inverse selection transistors from the present embodiment. Moreover, in this embodiment, the gate voltage $V_G$ during the storing period is different from that during the reading out period, but use may be made of the value $V_{\phi G}$ both during the storing period and the reading out period. In this case, since the gate pulse $\phi_{\phi G}$ needs only two levels, the vertical scanning circuit 256 can be made simple in construction.

In the first embodiment, the source terminals of all the LSITs 250-11, 250-12, . . . , 250-mn are maintained at a certain constant potential i.e. the ground level, but the source terminals of respective columns of the LSITs are commonly connected to a horizontal reset circuit consisting of a shift register arranged parallely with the horizontal scanning circuit 257.

Figure 30:
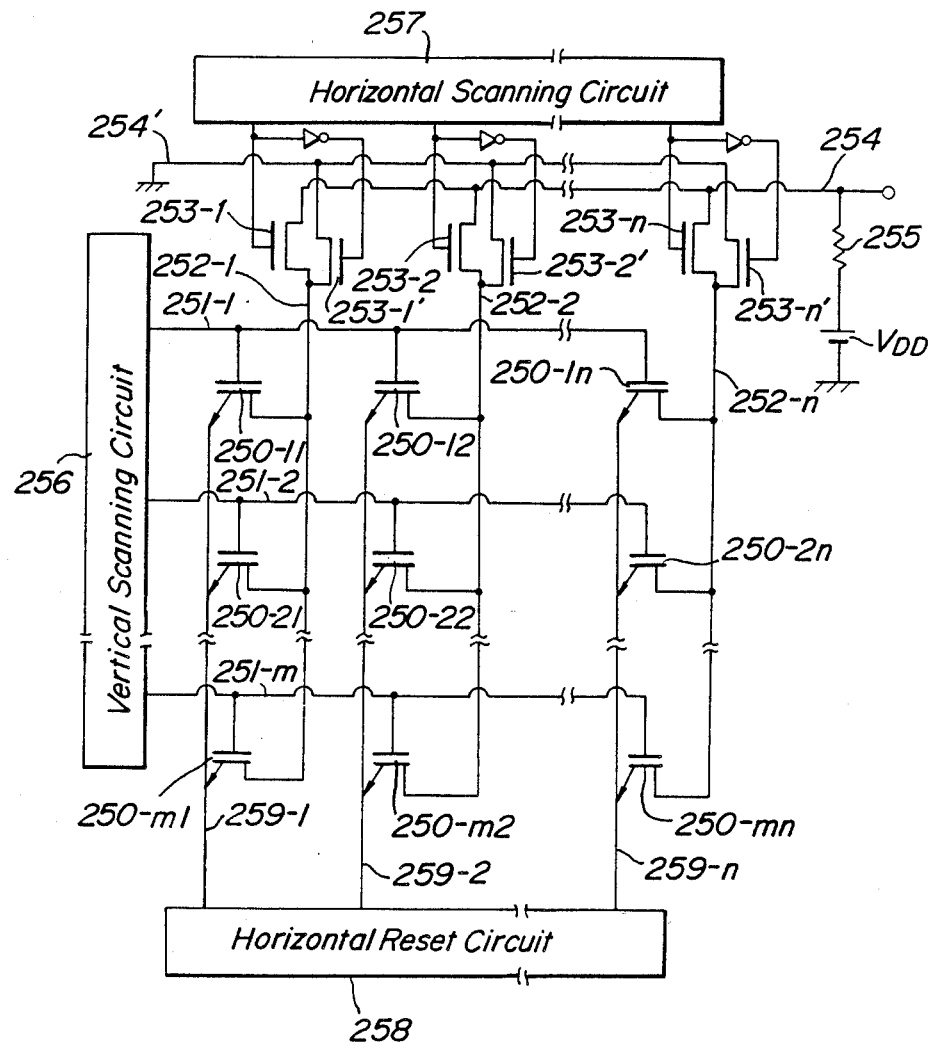
FIG. 30 is a circuit diagram illustrating a second embodiment of the solid state image sensor according to the invention in which the selection of a solid state image pick-up element is performed due to the gate and drain voltages.

FIG. 30 shows a second embodiment of the solid state image sensor utilizing the horizontal scanning circuit mentioned above. In FIG. 30, the source terminals of respective columns of the LSITs 250-11, 250-21, . . . , 250-m1; 250-12, 250-22, . . . , 250-m2; . . . ; 250-1n, 250-2n, . . . , 250-mn are commonly connected to respective source lines 259-1, 259-2, . . . , 259-n which are further connected to a horizontal reset circuit 258 arranged in parallel with the horizontal scanning circuit 257.

Next, the operation of the embodiment will be explained with reference to FIGS. 31A to 31I. When the signal $\phi_{G1}$ becomes the value $V_{\phi G}$ as shown in FIG. 31A by means of the vertical scanning circuit 256, the LSITs 250-11, 250-12, . . . , 250-1n of the row line 251-1 are selected, and the horizontal selection transistors 243-1, 253-2, . . . , 253-n are successively turned on by means of the gate signals $\phi_{D1}, \phi_{D2}, \ldots$ supplied successively from the horizontal scanning circuit 257 as shown in FIGS. 31D to 31F. Then, the selected LSITs 250-11, 250-12, . . . , 250-1n are successively turned on, and a source-drain current corresponding to the light charge stored in the gate region flows through the video line 254, so that the output signal can be derived between the load resistor 255. The reset operation of respective LSITs are effected in such a manner that signals $\phi_{s1}, \phi_{s2}, \ldots, \phi_{sn}$ are successively supplied to the source lines 259-1, 259-2, . . . , 259-n just after the signal $\phi_{D1}, \phi_{D2}, \ldots, \phi_{Dn}$, as shown in FIGS. 31G to 31I. This is, the positive holes stored in the gate region can be discharged in such a manner that a forward bias voltage with respect to the gate voltage $V_{\phi G}$ is applied to the source region of respective LSITs.

In the first embodiment, the reset operation is performed on every row of the LSITs, but, in the second embodiment mentioned above, since it is possible to effect the reset operation on all of the LSITs, light storing periods of all the LSITs can be made completely identical with each other. Moreover, since the gate voltage needs only two pulse levels, the vertical scanning circuit 256 can be made simple in construction.

Figure 32:
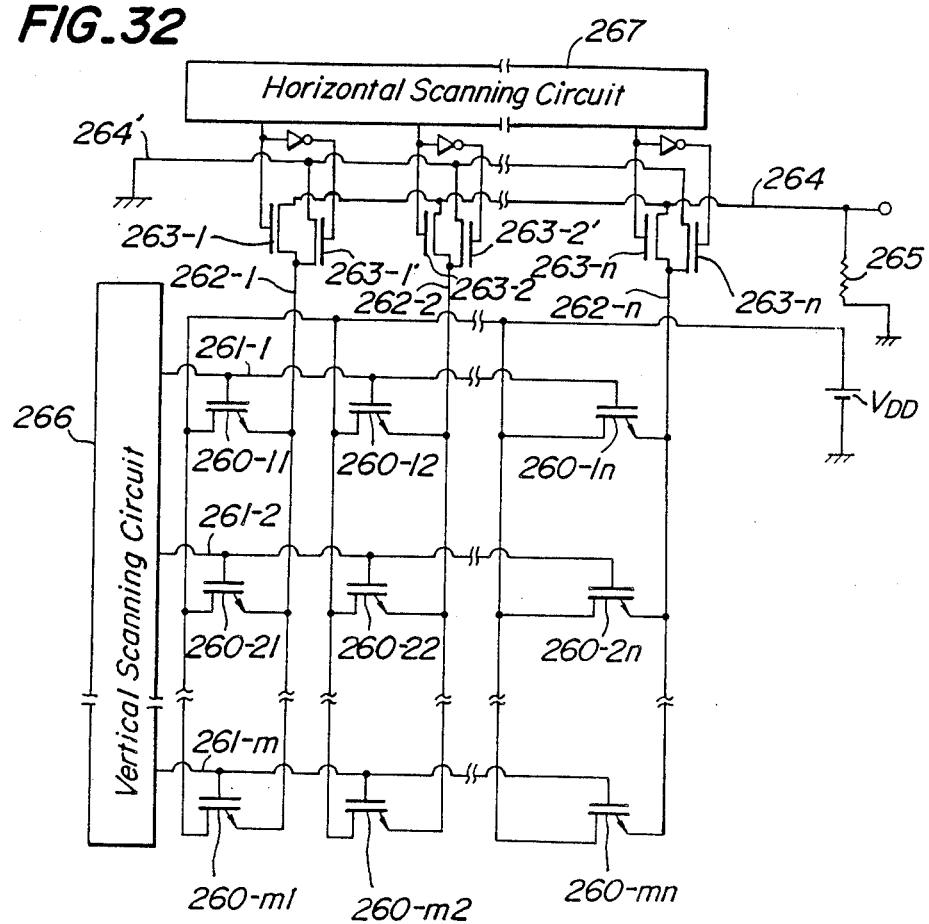
FIG. 32 is a circuit diagram depicting a third embodiment of the solid state image sensor according to the invention in which the selection of a solid state image pick-up element is performed due to the source and gate voltages.

FIG. 32 is a third embodiment of the solid state image sensor according to the invention which utilizes the source-gate selection method. As shown in FIG. 32, the solid state image sensor of this embodiment has the same construction as that of the embodiments mentioned above such that LSITs 260-11, 260-12, . . . , 260-mn are arranged in a matrix manner and the signal is read out by the XY address method. In this embodiment, the drain terminals of all the LSITs each consisting of one pixel are commonly connected to the video power source $V_{DD}$, and the gate terminals of respective rows of LSITs arranged in X direction are respectively connected to row lines 261-1, 261-2, . . . , 261-m. Moreover, the source terminals of the respective columns of the LSITs arranged in Y direction are respectively connected to column lines 262-1, 262-2, . . . , 262-n, and these column lines are further connected to a video line 264 and a ground line 264' through column selection transistors 263-1, 263-2, . . . , 263-n and 263-1', 263-2', . . . , 263-n', respectively. The video line 264 is connected to the ground through a load resistor 265. Further, the row lines 261-1, 261-2, . . . , 261-m are connected to a vertical scanning circuit 266 so as to be applied to the signals $\phi_{G1}$, $\phi_{G2}$, . . . , $\phi_{Gm}$ respectively. Moreover, the gate terminals of the column selection transistors 263-1, 263-2, . . . , 263-n and 263-1', 263-2', . . . , 263-n' are connected to a horizontal scanning circuit 267 so as to be applied to the signals $\phi_{s1}$, $\phi_{s2}$, . . . , $\phi_{sn}$ and the inverse signals thereof, respectively.

Figure 33:
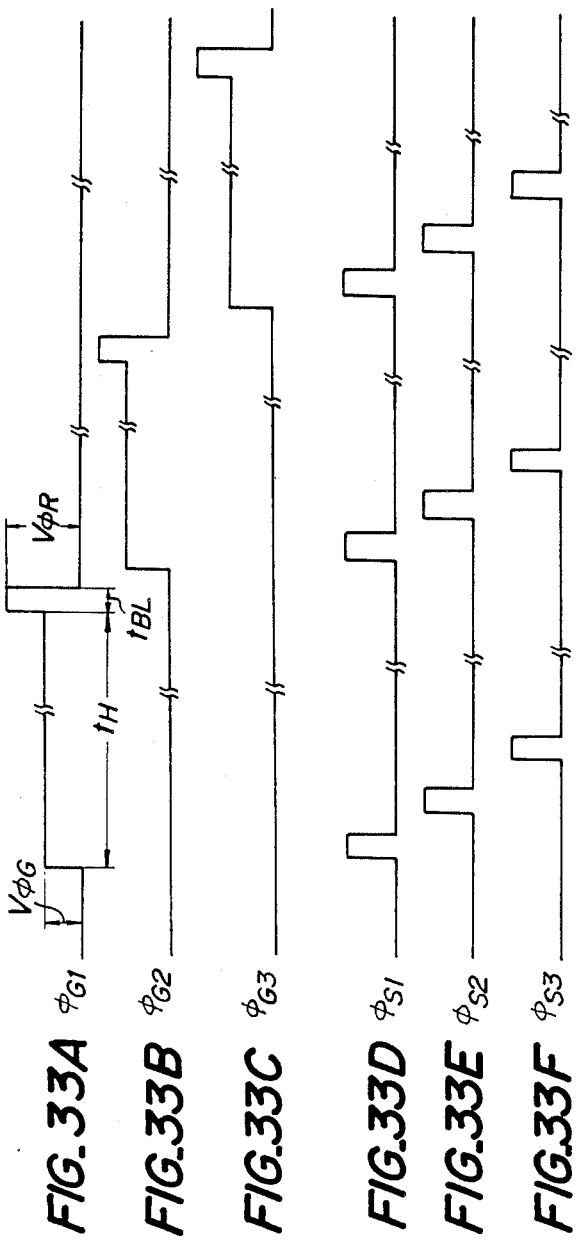
FIGS. 33A to 33F are waveforms for respectively explaining the operation of the solid state image sensor shown in FIG. 32.

Next, the vertical scanning signal $\phi_G$ and the horizontal scanning signal $\phi_s$ will be explained with reference to FIGS. 33A to 33F. Each signal $\phi_{G1}$, $\phi_{G2}$, . . . applied to the row lines 261-1, 261-2, . . . consists of a reading out gate voltage $V_{\phi G}$ aving a small amplitude and a reset gate voltage $V_{\phi R}$ having a larger amplitude than that of the $V_{\phi G}$. The value of each signal $\phi_{G1}$, $\phi_{G2}$, . . . is maintained in the $V_{\phi G}$ during one line scanning period $t_H$, and is set to the $V_{\phi R}$ during a horizontal blanking period $t_{BL}$ from the end of one line scanning period to the start of the next scanning period, as shown in FIGS. 33A to 33C. The horizontal scanning signals $\phi_{s1}$, $\phi_{s2}$, . . . applied to the gate terminals of the column selection transistors 263-1, 263-2, . . . , 263-n function to select the column lines 262-1, 262-2, . . . , in such a manner that a low level of this signal turns the column selection transistors 263-1, 263-2, . . . , 263-n, off and the inverse selection transistors 263-1', 263-2', . . . , 263-n' on, and a high level of this signal turns the column selection transistors on and the inverse selection transistors off.

Hereinafter, the operation of the solid state image sensor shown in FIG. 32 will be explained on the basis of the operation of the LSIT mentioned above. When the signal $\phi_{G1}$ becomes the reading out voltage $V_{\phi G}$ as shown in FIG. 33A by means of the vertical scanning circuit 266, the LSITs 260-11, 260-12, . . . , 260-1n connected to the row lines 261-1 are selected and the horizontal selection transistors 263-1, 263-2, . . . , 263-n are successively turned on by means of the signals $\phi_{s1}$, $\phi_{s2}$, . . . , $\phi_{sn}$ supplied from the horizontal scanning circuit 267 as shown in FIGS. 33D to 33F, so that the signals generated in the LSITs 260-11, 260-12, . . . , 260-1n are successively outputted from the video line 264. Then, if the signal $\phi_{G1}$ becomes the high level $V_{\phi R}$, these LSITs 260-11, 260-12, . . . , 260-1n are reset at the same time. Next, when the signal $\phi_{G2}$ becomes the value $V_{\phi G}$ as shown in FIG. 33B, the LSITs 260-21, 260-22, . . . , 260-2n connected to the row lines 261-2 are selected, and the light signals generated in the LSITs 260-21, 260-22, . . . , 260-2n are read out successively. After that, all the LSITs 260-21, 260-22, . . . , 260-2n are reset simultaneously. Then, the light signals of the LSITs are read out successively in this manner, video signals corresponding one field can be obtained.

In this embodiment, the inverse selection transistors 263-1', 263-2', . . . , 263-n' function to set the source terminals of the non-selected LSITs to the ground potential. However, since the light signal can be stored in the gate region even if these inverse transistors are not utilized, it is possible to remove the inverse selection transistors from the present embodiment. Moreover, in this embodiment, the gate voltage $V_C$ during the storing period can be set to the same voltage as that during the storing period.

According to the present embodiment, a connection of the drain can be made simple in construction as compared with the first embodiment, and an isolation between pixels can be made simple. Therefore, it is confirmed experimentally that the present embodiment can be preferably applied to an integration of one pixel. Further, the influence of the drain stray capacitance can be made smaller, the load capacitance for the column lines 262-1, . . . 262-n can be made small, and the potential difference at the column lines can be made low. Therefore, the present embodiment is particularly preferable for driving the image sensor having a large number of pixels at a high speed.

Figure 34:
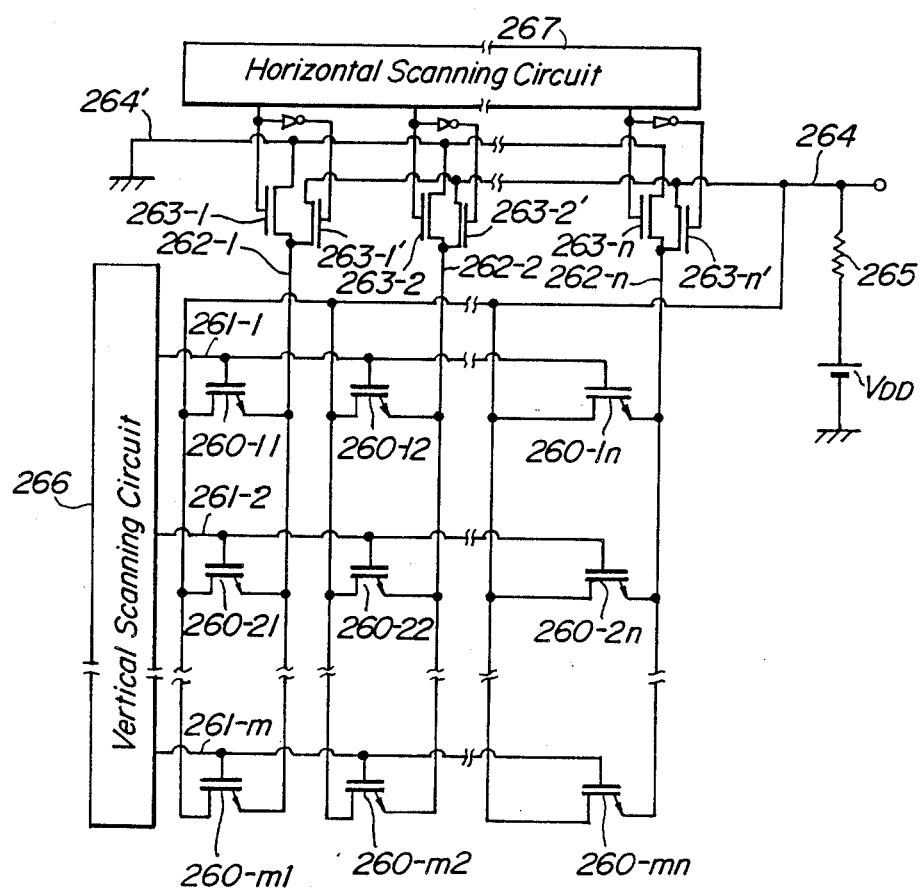
FIG. 34 is a circuit diagram showing a fourth embodiment of the solid state image sensor according to the invention in which the selection of a solid state image pick-up element is performed due to the source and gate voltages.

In the third embodiment shown in FIG. 32, the drain terminals of respective LSITs are commonly connected to the power source $V_{DD}$, but as shown in FIG. 34 the drain terminals of respective LSITs may be commonly connected to the power source $V_{DD}$ through the load resistor 265. In the fourth embodiment mentioned above, since the source and drain terminals of all the non-selected LSITs are connected through the inverse selection transistors with each other, no inverse selection signals are outputted from the LSITs other than the selected LSITs. The constructions of the fourth embodiment other than that mentioned above are the same as those of the third embodiment.

FIG. 35 is a circuit diagram showing a fifth embodiment of the solid state image sensor according to the invention which utilizes the source-drain selection method. In the present embodiment of the solid state image sensor shown in FIG. 35, m×n LSITs 270-11, 270-12, . . . , 270-mn are arranged in a matrix manner, and successive signals are derived from the LSTs 270-11 to 270-mn by the XY address method. That is, the gate terminal of respective LSITs each representing one pixel is connected to the ground, and the source terminals of respective lines of LSITs arranged in X direction are respectively connected to row lines 271-1, 271-2, . . . , 271-m. Further, the drain terminals of respective columns of LSITs arranged in Y direction are respectively connected to column lines 272-1, 272-2, . . , 272-n, and these column lines are respectively connected to the video line 274 and the video power source $V_{DD}$ through column selection transistors 273-1, 273-2, . . . , 273-n and 273-1', 273-2', . . . 237-n', respectively. The video line 274 is connected to the video power source $V_{DD}$ through an ammeter 275. The row lines 271-1, 271-2, . . . , 271-m are connected to a vertical scanning circuit 276, and signals $\phi_{s1}$, $\phi_{s2}$, . . . , $\phi_{sm}$ are successively supplied thereto. Moreover, the gate terminals of the column selection transistors 273-1, 273-2, . . . , 273-n and 273-1', 273-2', . . . , 273-n' are connected to a horizontal scanning circuit 277 through which the signals $\phi_{D1}, \phi_{D2}, \ldots, \phi_{Dn}$ and the inverse signals thereof are supplied thereto respectively.

Next, the vertical scanning signal $\phi_s$ and the horizontal scanning signal $\phi_D$ will be explained with reference to the waveforms shown in FIGS. 36A to 36F. Each signal $\phi_{s1}, \phi_{s2}, \ldots$ applied to the row lines consists of a reading out source voltage $V_{\phi s}$ having a small amplitude and a reset voltage $V_{\phi R}$ having a larger amplitude than that of the $V_{\phi s}$. The value of each singal $\phi_{s1}, \phi_{s2}, \ldots$ is maintained at the $V_{\phi s}$ during one line scanning period $t_H$, and is set to the $V_{\phi R}$ during a blanking period $t_{BL}$ from the end of one line scanning period to the start of the next scanning period, as shown in FIGS. 36A to 36C. The horizontal scanning signals $\phi_{D1}, \phi_{D2}, \ldots$ applied to the gate terminals of the column selection transistors 273-1, 273-2, . . . , 273-n function to select the column lines, in such a manner that a low level of this signal turns the column selection transistors 273-1, 273-2, . . . , 273-n, off and the inverse selection transistors 273-1', 273-2', . . . , 273-n' on, and a high level of this signal turns the column selection transistors on and the inverse selection transistors off.

Hereinafter, the operation of the solid state image sensor shown in FIG. 35 will be explained on the basis of the operation of the LSIT mentioned above. When the signal $\phi_{s1}$ becomes the reading out voltage $V_{\phi s}$ as shown in FIG. 36A by means of the vertical scanning circuit 276, the LSITs 270-11, 270-12, . . . , 270-1n connected to the row lines 271-1 are selected, and the horizontal selection transistors 273-1, 273-2, . . . , 273-n are successively turned on by means of the signals $\phi_{D1}, \phi_{D2}, \ldots, \phi_{Dn}$ supplied from the horizontal scanning circuit 277 as shown in FIGS. 36D to 36F, so that the signals generated in the LSITs 270-11, 270-12, . . . , 270-1n are successively outputted from the video line 274. Then, when the signal $\phi_{s1}$ becomes the high level $V_{\phi R}$ at the end of the blanking period $t_{BL}$, these LSITs 270-11, 270-12, . . . , 270-1n are reset at the same time. Next, when the signal $\phi_{s2}$ becomes the $V_{\phi s}$ as shown in FIG. 36B, the LSITs 270-21, 270-22, . . . , 270-2n connected to the row line 271-2 are selected, and the light signals generated in the LSITs 270-21, 270-22, . . . , 270-2n are read out successively. After that, all the LSITs 270-21, 270-22, . . . , 270-2n are reset simultaneously. Then, the light signals of the LSITs are read out successively in this manner, and video signals representing one field can be obtained.

In this embodiment, the inverse selection transistors 273-1', 273-2', . . . , 273-n' function to set the drain terminals of the non-selected LSITs to the potential of the voltage source $V_{DD}$. However, since the light signal can be stored in the gate region even if these inverse transistors are not utilized, it is possible to remove the inverse selection transistors from the present embodiment.

According to the present embodiment, no inverse selection signals are outputted from the LSITs other than the selected LSITs.

As explained above, according to the invention, since the solid state image pick-up element utilizes the static induction transistor, not only the photoelectric converting function but also amplification can be realized. Therefore, S/N can be made larger as compared with the MOS transistor and the CCD both having no amplification function. Further, since use is made of the lateral type construction in which the source, drain and gate regions are formed in the surface of the semiconductor layer, the construction thereof can be made compact as compared with the vertical type construction, and the size control can be made easily. In addition, the light amplification rate and the light sensitivity can be improved in an easy manner and the process thereof can be also made simple. Moreover, if peripheral devices are to be formed by the MOS construction, the process of this invention can be matched with the MOS process. Therefore, the process efficiency can be improved, and the arrangement of the terminals can be designed freely as compared with the vertical type construction. Further, since at least one of the source and drain regions are surrounded by the gate region, the area of the channel region can be widened. Therefore, a large amount of light charges can be stored in the gate regions, and thus the good S/N can be realized.

Furthermore, according to the invention, since the size of the device can be made small, the device can be preferably integrated and thus can be preferably applied to a three-dimensional multi-layer device.

Moreover, according to the solid state image sensor of the present invention, since the source and drain regions can be inversely biased during the light signal storing period and the source or drain region is connected to the ground during the signal reading out period, the light charge can be preferably stored in the gate region during the storing period, and the source-drain current in response to the amount of light charges stored in the gate region can be obtained during the storing period. Therefore, it is possible to realize a good photoelectric converting operation, and thus it is possible to obtain the output signal accurately corresponding to the incident light amount. Moreover, it is possible to realize the most suitable photoelectric converting operation under various incident light intensities by adjusting the storing period and the gate reading out voltage in response to the incident light amount. Further, as for the signal reading out method, since use is made of the gate-drain selection method, the source-gate selection method and the source-drain selection method arbitrarily, the freedom of design can be improved largely and the most suitable selection method corresponding to various requirements can be utilized.

What is claimed is:

1. A solid state image pick-up element including a static induction transistor comprising:
   a substrate made of a semiconductor material having a high resistivity, or an insulating material;
   a semiconductor layer formed on said substrate;
   a source region and a drain region formed in a surface of said semiconductor layer; and
   gate means, formed in said surface of said semiconductor layer and completely surrounding at least one of said source region and said drain region, for storing photocarriers generated by light excitation, and for controlling a source-drain current flowing in parallel with the surface of said semiconductor layer according to an amount of said stored photocarriers.

2. A solid state image pick-up element according to claim 1, wherein said gate means completely surrounds both said source region and said drain region.

3. A solid state image pick-up element according to claim 1, wherein said gate means completely surrounds said source region, and said drain region is arranged outside said gate means.

4. A solid state image pick-up element according to claim 1, wherein said gate means completely surrounds said drain region, and said source region is arranged outside said gate means.

5. A solid state image pick-up element according to claim 1, wherein a part of said semiconductor layer in which said source region, drain region and gate means are formed is isolated from other parts of said semiconductor layer by an isolation region made of a diffusion layer having an opposite conductivity type to that of said semiconductor layer.

6. A solid state image pick-up element according to claim 5, wherein said isolation region comprises said drain region or said source region arranged outside said gate means.

7. A solid state image pick-up element according to claim 1, wherein said static induction transistor comprises a plurality of gate means.

8. A solid state image pick-up element according to claim 1, wherein said gate means has a junction gate construction comprising a region being of an opposite conductivity type to that of said semiconductor layer and being formed in said semiconductor layer and a gate electrode connected to said region.

9. A solid state image pick-up element according to claim 1, wherein said gate means has an insulating gate construction comprising an insulating film, arranged on a surface of said semiconductor layer and a gate electrode formed on said insulating film.

10. A solid stage image pick-up element according to claim 9, wherein said gate means further comprises a gate layer being of an opposite conductivity type to that of said semiconductor layer and arranged in a surface of said semiconductor layer connected to said insulating film.

11. A solid state image pick-up element according to claim 1, wherein said source region, drain region and gate means are arranged in a concentric manner.

12. A solid state image sensor comprising:
a solid state image pick-up element including:
at least one static induction transistor comprising a substrate made of a semiconductor material having a high resistivity, or an insulating material, a semiconductor layer formed on said substrate, a source region and a drain region formed in a surface of said semiconductor layer, and gate means, formed in the surface of said semiconductor layer and completely surrounding at least one of said source region and said drain region, for storing photocarriers generated by light excitation, and for controlling a source-drain current flowing in parallel with the surface of said semiconductor layer according to an amount of said stored photocarriers;
means for reverse biasing said source region and drain region during a light signal storing period; and
means for reading out a light signal stored in said solid state image pick-up element during a signal reading out period.

13. A solid state image sensor according to claim 12, wherein said signal reading out means comprises means for flowing a source-drain current in response to an amount of photocarriers stored in said gate means by connecting said source region or drain region to a ground during a signal reading out period.

14. A solid state image sensor according to claim 12, further comprising reset means for discharging photocarriers stored in said gate means after the end of a signal reading out period by means of said signal reading out means.

15. A solid state image sensor according to claim 14, wherein said reset means has a construction such that the photocarriers stored in said gate region are discharged by increasing a reverse bias applied to said semiconductor substrate.

16. A solid state image sensor according to claim 14, further comprising means for adjusting a gate voltage in response to an incident light intensity during the reading out period by means of the signal reading out means.

17. A solid state image sensor comprising:
an array of a plurality of solid state image pick-up elements arranged in a matrix, each element including a static induction transistor comprising:
a substrate made of a semiconductor material having a high resistivity, or insulating material, a semiconductor layer formed on said substrate, a source region and a drain region formed in a surface of said semiconductor layer, and gate means, formed in said surface of said semiconductor layer and completely surrounding at least one of said source region and said drain region, for storing photocarriers generated by light excitation and for controlling a source-drain current flowing in parallel with the surface of said semiconductor layer according to an amount of said stored photocarriers; and
scanning means for scanning successive solid state image pick-up elements in said array whereby during a light signal storing period in which photocarriers are stored in said gate means, said source and drain regions are reversed biased so that no output signals are generated, and whereby during a signal reading out period the source-drain current flows according to an amount of the photocarriers stored in said gate means by connecting said source region or said drain region to a ground.

18. A solid state image sensor according to claim 17, wherein said scanning means has a construction such that source terminals of respective solid state image pick-up elements are connected to a constant potential, and gate and drain terminals thereof are connected to a horizontal scanning circuit and a vertical scanning circuit respectively, whereby respective solid state image pick-up elements are successively selected by controlling gate and drain voltages.

19. A solid state image sensor according to claim 17, wherein said scanning means has a construction such that drain terminals of respective solid state image pick-up elements are connected to a constant potential, and gate and source terminals thereof are connected to a horizontal scanning circuit and a vertical scanning circuit respectively, whereby respective solid state image pick-up elements are successively selected by controlling gate and source voltages.

20. A solid state image sensor according to claim 17, wherein said scanning means has a construction such that gate terminals of respective solid state image pick-up elements are connected to a constant potential, and source and drain terminals thereof are connected to a horizontal scanning circuit and a vertical scanning circuit respectively, whereby respective solid state image pick-up elements are successively selected by controlling source and drain voltages.

* * * * *